United States Patent
Kutz et al.

(10) Patent No.: US 12,355,475 B2
(45) Date of Patent: Jul. 8, 2025

(54) DIGITAL PRE-DISTORTION AND ASSISTANCE INFORMATION SIGNALING

(71) Applicant: QUALCOMM Incorporated, San Diego, CA (US)

(72) Inventors: Gideon Shlomo Kutz, Ramat Hasharon (IL); Igor Gutman, Hod HaSharon (IL); Amit Bar-Or Tillinger, Tel-Aviv (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/652,523

(22) Filed: May 1, 2024

(65) Prior Publication Data

US 2024/0283475 A1  Aug. 22, 2024

Related U.S. Application Data

(62) Division of application No. 17/655,517, filed on Mar. 18, 2022, now Pat. No. 12,009,848.

(51) Int. Cl.
  *H04B 1/04*  (2006.01)
(52) U.S. Cl.
  CPC ... *H04B 1/0475* (2013.01); *H04B 2001/0425* (2013.01)
(58) Field of Classification Search
  CPC .......... H04B 1/0475; H04B 2001/0425; H03F 2200/451; H03F 3/189; H03F 3/24; H03F 1/3247; H04W 8/24
  See application file for complete search history.

(56) References Cited

U.S. PATENT DOCUMENTS 8,594,232 B2 * 11/2013 Koren ................... H04L 27/366
                                                             375/345
8,633,769 B2     1/2014 Bai et al.
(Continued)

FOREIGN PATENT DOCUMENTS

WO        2018148822 A1    8/2018

OTHER PUBLICATIONS

Fu Z., et al., "Frequency-Selective Digital Predistortion for Unwanted Emission Reduction", IEEE Transactions on Communications, IEEE Service Center, Piscataway, NJ, USA, vol. 63, No. 1, Jan. 1, 2015, pp. 254-267, XP011569870, 15 Pages, paragraph [000I]-paragraph [0VII], figures 1-13, Abstract, p. 254, Right-hand Column, Line 1—p. 266, Left-hand Column, Line 10.

(Continued)

*Primary Examiner* — Vineeta S Panwalkar
(74) *Attorney, Agent, or Firm* — Patterson + Sheridan, L.L.P./Qualcomm

(57) ABSTRACT

Certain aspects of the present disclosure provide techniques for digital pre-distortion (DPD). An apparatus for wireless communication generally includes a power amplifier (PA); a first DPD circuit, a second DPD circuit, and a transmitter. The first DPD circuit is generally configured to: obtain an input signal; apply a first DPD to the input signal to generate a first resulting signal; and output the first resulting signal to the second DPD circuit. The second DPD circuit is generally configured to: obtain the first resulting signal from the first DPD circuit; apply a second DPD to the first resulting signal to generate a second resulting signal; and output the second resulting signal to the PA. The PA is generally configured to amplify the second resulting signal to generate an amplified second resulting signal. The transmitter is generally configured to transmit the amplified second resulting signal to a second apparatus.

30 Claims, 17 Drawing Sheets

(56) References Cited

U.S. PATENT DOCUMENTS

| | | |
|---|---|---|
| 2004/0155707 A1 | 8/2004 | Kim et al. |
| 2010/0253426 A1 | 10/2010 | Su et al. |
| 2016/0285485 A1 | 9/2016 | Fehri et al. |
| 2023/0299800 A1 | 9/2023 | Kutz |

OTHER PUBLICATIONS

Hussein M.A., et al., "Multi-Stage Digital Predistortion Based on Indirect Learning Architecture", ICASSP, IEEE International Conference on Acoustics, Speech and Signal Processing—Proceedings 1999 IEEE, IEEE, May 26, 2013, pp. 6093-6097, XP032507811, paragraph [000I]-paragraph [000V], figures 1-6.
International Search Report and Written Opinion—PCT/US2023/061271—ISA/EPO—Jul. 19, 2023.
Lin C-H., et al., "Dynamically Optimum Lookup-Table Spacing for Power Amplifier Predistortion Linearization", IEEE Transactions on Microwave Theory and Techniques, IEEE, USA, vol. 54, No. 5, May 1, 2006, XP001545137, pp. 2118-2127, figures 1-10.
Liu Z., et al., "A Digital Predistortion Method for Multi-Band Aggregation", 2017 IEEE 17th International Conference on Communication Technology (ICCT), IEEE, Oct. 27, 2017, XP033339922, pp. 343-349, paragraph [000I]-paragraph [00IV], figures 1-14.
Partial International Search Report—PCT/US2023/061271—ISA/EPO—May 22, 2023.

\* cited by examiner

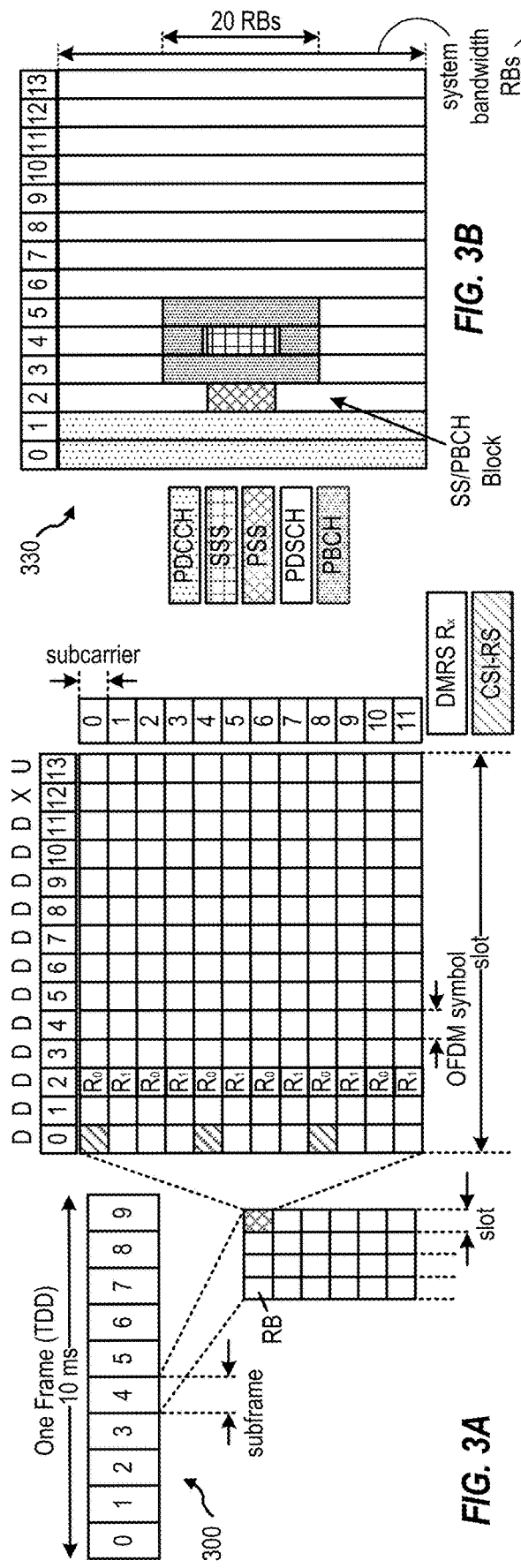
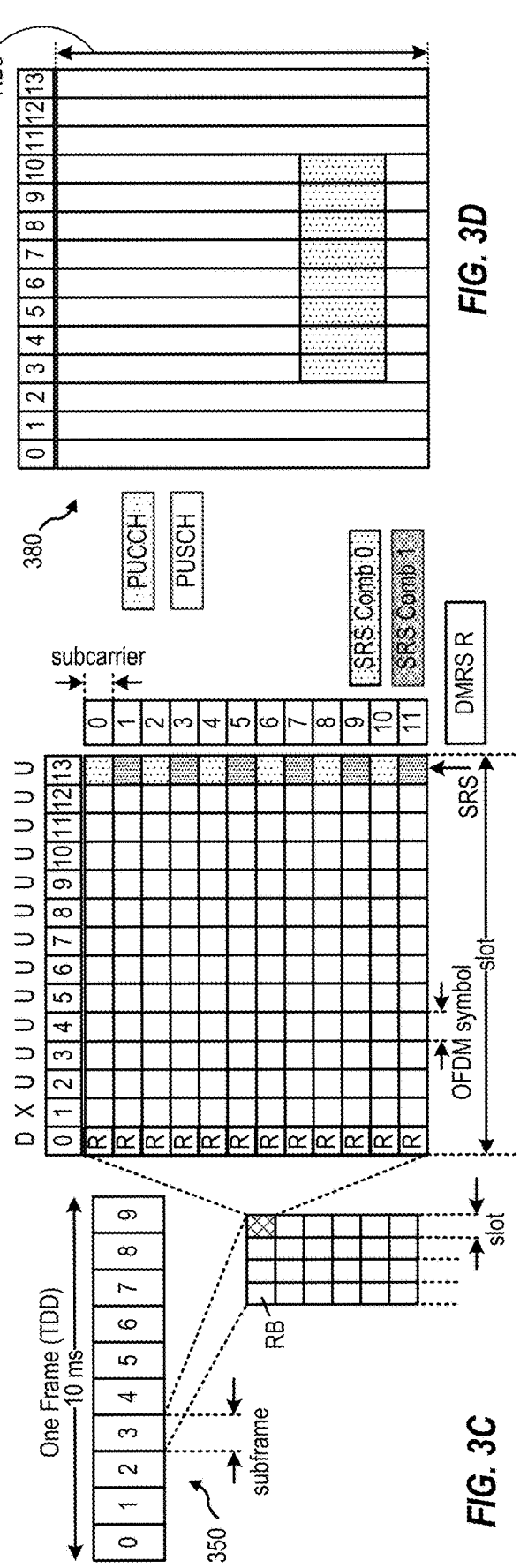

DIGITAL PRE-DISTORTION AND ASSISTANCE INFORMATION SIGNALING

This application is a divisional of U.S. patent application Ser. No. 17/655,517, filed Mar. 18, 2022, which is expressly incorporated by reference herein in its entirety as if fully set forth below and for all applicable purposes.

BACKGROUND

Field of the Disclosure

Aspects of the present disclosure relate to wireless communications, and more particularly, to techniques for digital pre-distortion (DPD) and digital post-distortion (DPOD).

Description of Related Art

Wireless communication systems are widely deployed to provide various telecommunication services such as telephony, video, data, messaging, broadcasts, or other similar types of services. These wireless communication systems may employ multiple-access technologies capable of supporting communication with multiple users by sharing available wireless communication system resources with those users Although wireless communication systems have made great technological advancements over many years, challenges still exist. For example, complex and dynamic environments can still attenuate or block signals between wireless transmitters and wireless receivers. Accordingly, there is a continuous desire to improve the technical performance of wireless communications systems, including, for example: improving speed and data carrying capacity of communications, improving efficiency of the use of shared communications mediums, reducing power used by transmitters and receivers while performing communications, improving reliability of wireless communications, avoiding redundant transmissions and/or receptions and related processing, improving the coverage area of wireless communications, increasing the number and types of devices that can access wireless communication systems, increasing the ability for different types of devices to intercommunicate, increasing the number and type of wireless communication mediums available for use, and the like. Consequently, there exists a need for further improvements in wireless communications systems to overcome the aforementioned technical challenges and others.

SUMMARY

One aspect provides an apparatus for wireless communication. The apparatus generally includes a PA. The apparatus generally includes a first DPD circuit configured to: obtain an input signal; apply a first DPD to the input signal to generate a first resulting signal; and output the first resulting signal to a second DPD circuit. The apparatus generally includes the second DPD circuit configured to: obtain the first resulting signal from the first DPD circuit; apply a second DPD to the first resulting signal to generate a second resulting signal; and output the second resulting signal to the PA. The PA is configured to amplify the second resulting signal to generate an amplified second resulting signal. The apparatus generally includes a transmitter configured to transmit the amplified second resulting signal to a second apparatus.

One aspect provides a method for wireless communication by a first device. The method generally includes transmitting an indication, to a second device, indicating an effective PA model of a PA of the first device has changed. The method generally includes applying a DPD to a first signal input to the PA. The DPD is based on the effective PA model that has changed. The method generally includes transmitting a signal output of the PA to the second device.

One aspect provides another method for wireless communication by a first device. The method generally includes receiving signaling from a second device indicating an effective PA model of a PA of the second device has changed. The method generally includes applying a DPoD to a signal received from the second device based on the effective PA model that has changed.

Other aspects provide: an apparatus operable, configured, or otherwise adapted to perform the aforementioned methods as well as those described elsewhere herein; a non-transitory, computer-readable media comprising instructions that, when executed by a processor of an apparatus, cause the apparatus to perform the aforementioned methods as well as those described elsewhere herein; a computer program product embodied on a computer-readable storage medium comprising code for performing the aforementioned methods as well as those described elsewhere herein; or an apparatus comprising means for performing the aforementioned methods as well as those described elsewhere herein. By way of example, an apparatus may comprise a processing system, a device with a processing system, or processing systems cooperating over one or more networks.

The following description and the appended figures set forth certain features for purposes of illustration.

BRIEF DESCRIPTION OF DRAWINGS

The appended figures depict certain features of the various aspects described herein and are not to be considered limiting of the scope of this disclosure.

FIGS. 3A, 3B, 3C, and 3D depict various example aspects of data structures for a wireless communication network.

DETAILED DESCRIPTION

Figure 1:
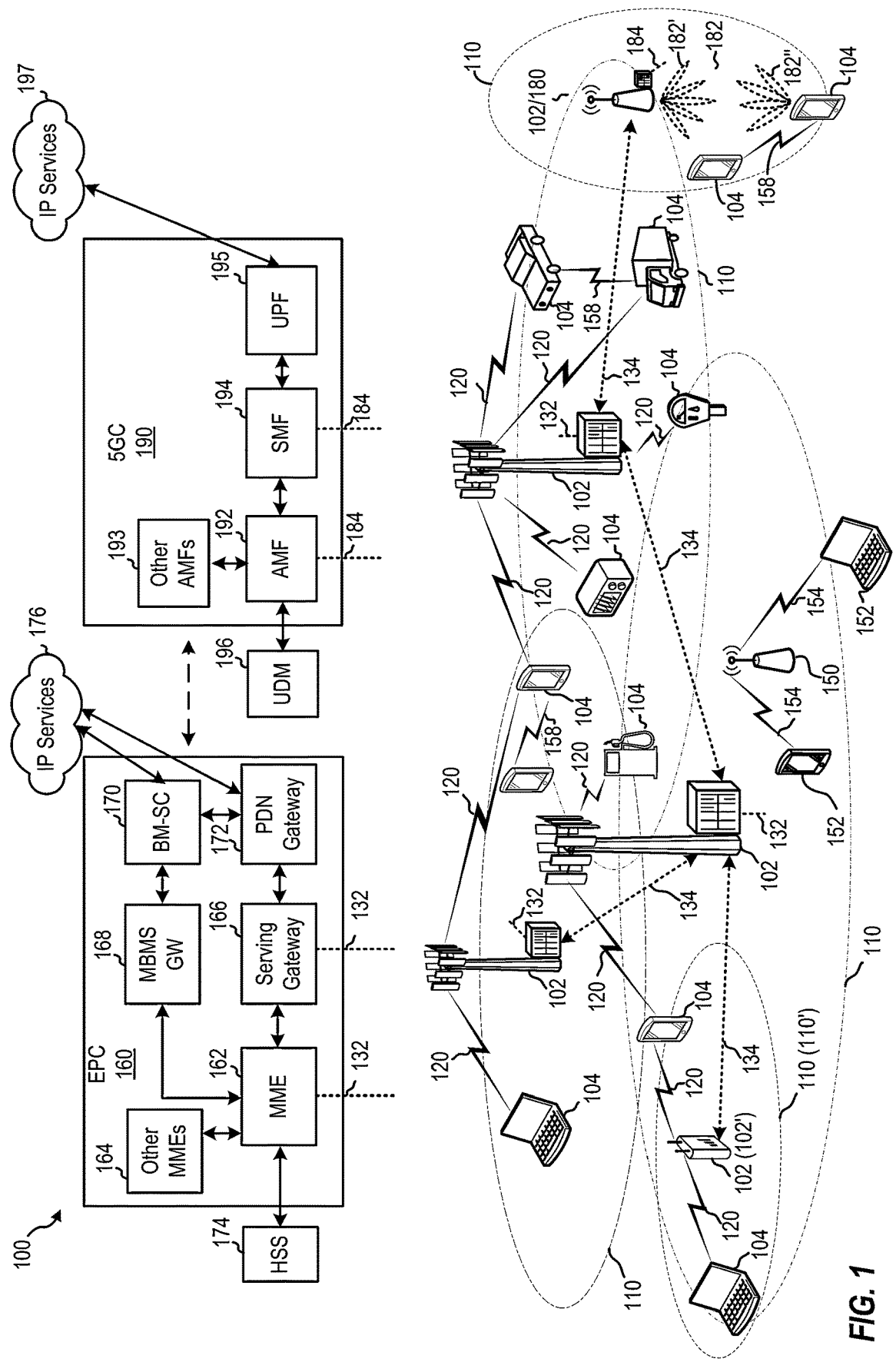
FIG. 1 is a block diagram conceptually illustrating an example wireless communication network.

Aspects of the present disclosure provide apparatuses, methods, processing systems, and computer-readable mediums for mitigating distortion caused by a power amplifier (PA) to a signal that is input to the PA. A PA is a device that increases (amplifies) the power of a signal input to the PA.

Some wireless communication networks, such as 5G new radio (NR) based networks, use an orthogonal frequency-division multiple access (OFDMA) digital modulation scheme. OFDMA offers multiple access by assigning subsets of subcarriers (corresponding to frequency resources) in each symbol (corresponding to a time resource) to different uplink transmissions, downlink transmissions, or both uplink and downlink transmissions, making efficient use of radio resources. OFDMA also provides simple channel estimation at a device receiving an OFDMA signal and flexibility in the utilization of time and frequency resources. However, OFDMA may result in a higher peak-to-average power ratio (PAPR).

A high power PA may be used to amplify the signal for transmission by a communications device (e.g., UE, network entity, etc.). High power PAs may have limited linear dynamic range and may generate non-linear components causing distortion in the signal output from the PA.

Ideally, all amplifiers should be perfectly linear, which means the output signal should be an (amplified) exact copy of the input signal. However, PAs are not perfectly linear because amplifying devices, such as transistors or vacuum tubes, are non-linear by nature which introduces some amount of non-linearity in the output (e.g., the amplified signal) of the PA. Non-linearity generates spectral re-growth, which leads to interference and can lead to violation of emissions standards set by regulatory bodies. Non-linearity can also lead to the degradation of the bit-error rate (BER) and data throughput of the communication system.

Non-linear distortion may be in-band and/or out-of-band. In-band distortion causes degradation of the EVM. EVM is a measure of the performance of a transmitter. A signal sent by an ideal transmitter would have all constellation points at the ideal locations, however distortion causes the actual constellation points to deviate from the ideal locations. Out-of-band distortion causes adjacent channel leakage ratio (ACLR) to increase and may result in interference. ACLR is the ratio of the transmitted power on the assigned channel by the transmitting device to the power received in the adjacent radio channel measured at a receiving device.

One technique of reducing non-linearity in a PA is back-off, where the PA is operated at a lower power level. Operating the PA at a lower power level helps ensure that the PA operates in the linear region. However, the back-off reduces the efficiency of the PA.

DPD and DPoD techniques allow PAs to be used near the saturation power of the PA to maximize efficiency and performance, while reducing distortion in the signal to avoid degradation of EVM and to avoid increase in the out-of-band emissions (measured, e.g., by the ACLR metric). Saturated output power is the maximum output power of the PA.

DPD is a technique where inverse distortion is applied, using a pre-distorter, to the input signal of the PA to cancel the distortion generated by the PA, at a transmitting device. To apply the correct inverse distortion, the characteristics of the PA should be accurately known and modeled. Techniques by a receiving device for mitigating the impact of distortion are referred to as DPoD. DPoD may be applied to a received signal after a radio frequency (RF) and analog-to-digital converter (ADC) in a receive chain of the receiving device.

Because DPD is performed before the signal is transmitted, DPD may be effective to mitigate both in-band and out-of-band distortion. DPoD, which is performed at the receiver, may only be effective to mitigate in-band distortion.

Aspects of the present disclosure provide a DPD technique. Some aspects of the present disclosure provide a frequency selective DPD technique. With frequency selective DPD, DPoD can be performed to mitigate in-band distortion, while the DPD can be applied in a frequency selective manner to mitigate distortion in-band, out-of-band, or both. For example, applying DPD to only out-of-band frequency bands may allow for better mitigation of the out-of-band distortion as compared to applying the DPD to both in-band and out-of-band frequency, while the DPoD can be applied to mitigate the in-band frequency bands.

According to certain aspects, the DPD can be applied in multiple iterations (e.g., via multiple stages). With multiple iterations, each iteration may better estimate the distortion and, therefore, better mitigate the distortion. Further, different iterations may apply the DPD to different frequency bands.

Aspects of the present disclosure provide assistance information that can be used for performing DPD and/or DPoD. By providing assistance information, the transmitter can determine the correct DPD to perform and the receiver can determine the correct DPoD to perform. Accordingly, in certain aspects, DPD can be dynamically performed at the transmitter to mitigate out-of-band distortion and DPoD can be dynamically performed at the receiver to mitigate in-band distortion. According to certain aspects, the transmitter can provide assistance information to the receiver that the receiver can use for performing DPoD. Further, in certain aspects, the receiver can provide assistance information to the transmitter that the transmitter can use for performing DPD. The assistance information may include an indication that the effective PA model (e.g., the concatenation of the crest factor reduction (CFR), DPD, and PA model) has changed, capability information, the changed effective PA model, information for determining the changed effective PA model, selected frequency DPD bands, DPD parameters, CFR parameters, and/or other assistance information discussed herein. The assistance information may be referred to as DPD/DPoD assistance information.

Introduction to Wireless Communication Networks

FIG. 1 depicts an example of a wireless communication network 100, in which aspects described herein may be implemented.

Generally, wireless communication network 100 includes various network entities (alternatively, network elements or network nodes), which are generally logical entities associated with, for example, a communication device and/or a communication function associated with a communication device. For example, various functions of a network as well as various devices associated with and interacting with a network may be considered network entities.

In the depicted example, wireless communication network 100 includes base stations (BSs) 102, user equipments (UEs) 104, and one or more core networks, such as an Evolved Packet Core (EPC) 160 and 5G Core (5GC) network 190, which interoperate to provide communications services over various communications links, including wired and wireless links.

BSs 102 wirelessly communicate with UEs 104 via communications links 120. The communication links 120 between BSs 102 and UEs 104 may include uplink (UL) (also referred to as reverse link) transmissions from a UE 104 to a BS 102 and/or downlink (DL) (also referred to as forward link) transmissions from a BS 102 to a UE 104. The communication links 120 may use multiple-input and multiple-output (MIMO) antenna technology, including spatial multiplexing, beamforming, and/or transmit diversity in various aspects.

Communications using higher frequency bands may have higher path loss and a shorter range compared to lower frequency communications. Accordingly, certain base stations (e.g., 180 in FIG. 1) may utilize beamforming 182 with a UE 104 to improve path loss and range. For example, base station 180 and the UE 104 may each include a plurality of antennas, such as antenna elements, antenna panels, and/or antenna arrays to facilitate the beamforming. In some cases, base station 180 may transmit a beamformed signal to UE 104 in one or more transmit directions 182'. UE 104 may receive the beamformed signal from the base station 180 in one or more receive directions 182". UE 104 may also transmit a beamformed signal to the base station 180 in one or more transmit directions 182". Base station 180 may also receive the beamformed signal from UE 104 in one or more receive directions 182'. Base station 180 and UE 104 may then perform beam training to determine the best receive and transmit directions for each of base station 180 and UE 104. Notably, the transmit and receive directions for base station 180 may or may not be the same. Similarly, the transmit and receive directions for UE 104 may or may not be the same.

In various aspects, a network entity or network node can be implemented as an aggregated base station, as a disaggregated base station, an integrated access and backhaul (IAB) node, a relay node, a sidelink node, to name a few examples.

Figure 2:
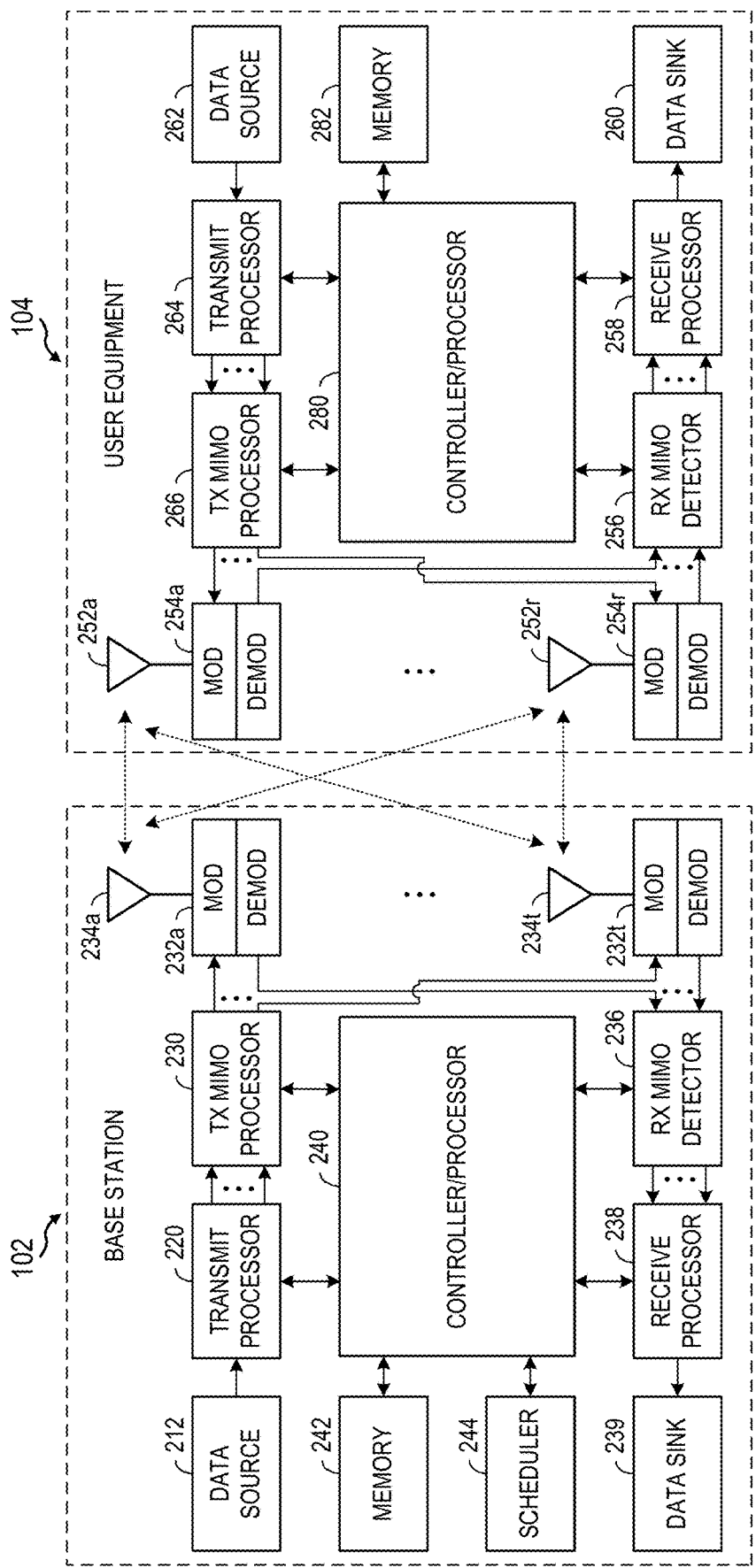
FIG. 2 is a block diagram conceptually illustrating aspects of an example base station and an example user equipment.

FIG. 2 depicts aspects of an example BS 102 and a UE 104.

Generally, BS 102 includes various processors (e.g., 220, 230, 238, and 240), antennas 234a-t (collectively 234), transceivers 232a-t (collectively 232), which include modulators and demodulators, and other aspects, which enable wireless transmission of data (e.g., data source 212) and wireless reception of data (e.g., data sink 239). For example, BS 102 may send and receive data between itself and UE 104. BS 102 includes controller/processor 240, which may be configured to implement various functions described herein related to wireless communications.

Generally, UE 104 includes various processors (e.g., 258, 264, 266, and 280), antennas 252a-r (collectively 252), transceivers 254a-r (collectively 254), which include modulators and demodulators, and other aspects, which enable wireless transmission of data (e.g., data source 262) and wireless reception of data (e.g., data sink 260). UE 104 includes controller/processor 280, which may be configured to implement various functions described herein related to wireless communications.

FIGS. 3A, 3B, 3C, and 3D depict aspects of data structures for a wireless communication network, such as wireless communication network 100 of FIG. 1. In particular, FIG. 3A is a diagram 300 illustrating an example of a first subframe within a 5G (e.g., 5G NR) frame structure, FIG. 3B is a diagram 330 illustrating an example of DL channels within a 5G subframe, FIG. 3C is a diagram 350 illustrating an example of a second subframe within a 5G frame structure, and FIG. 3D is a diagram 380 illustrating an example of UL channels within a 5G subframe.

Further discussions regarding FIG. 1, FIG. 2, and FIGS. 3A, 3B, 3C, and 3D are provided later in this disclosure.

Aspects Related to Iterative DPD and Assistance Information Signaling

Utilization efficiency of time and frequency resources, and the efficiency of radiated power, plays a significant role in wireless communication systems. As discussed herein, some wireless communication systems (e.g., wireless communication network 100) include a transmitter (e.g., a BS 102 or a UE 104) with non-linear components, such as high-power PAs with generally limited linear dynamic range. These non-linear components may distort a transmitted signal.

The non-linear distortions may be classified as in-band distortions or out-of-band distortions. In-band distortion affects link EVM performance. Out-of-band distortion dictates the amount adjacent channel interference (ACI), meaning how much the main transmission channel (corresponding to a frequency) interferes with an adjacent channel.

Generally, to avoid non-linear distortions, power back-off is introduced. However the power back-off comes with a cost: the higher the back-off, the lower the power efficiency. With a lower power efficiency, less power is transmitted to the medium, which can make it difficult for a receiving device to receive the transmission.

Figure 4:
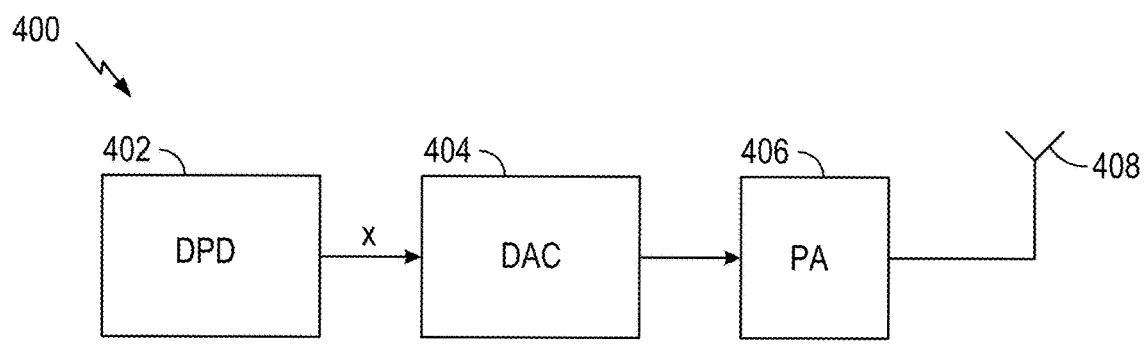
FIG. 4 is a block diagram conceptually illustrating an example transmit chain.

Another method to avoid non-linear distortions involves using DPD circuitry that applies DPD in the transmitter's digital front end. Using DPD, the amount of distortion may be kept at a target level, while the power back-off is reduced to be as low as possible and, hence, the PA efficiency may be improved. FIG. 4 illustrates an example transmit chain 400 having DPD circuitry 402. Generally, a communications device (e.g., a BS 102 or a UE 104 illustrated in FIG. 1) generates a signal to transmit using transmit chain 400. The signal starts in the digital domain before being converted to the analog domain by a digital-to-analog converter 404 and being sent to a PA 406. The PA 406 sends the analog signal to the antenna 408 for transmission.

Figure 5:
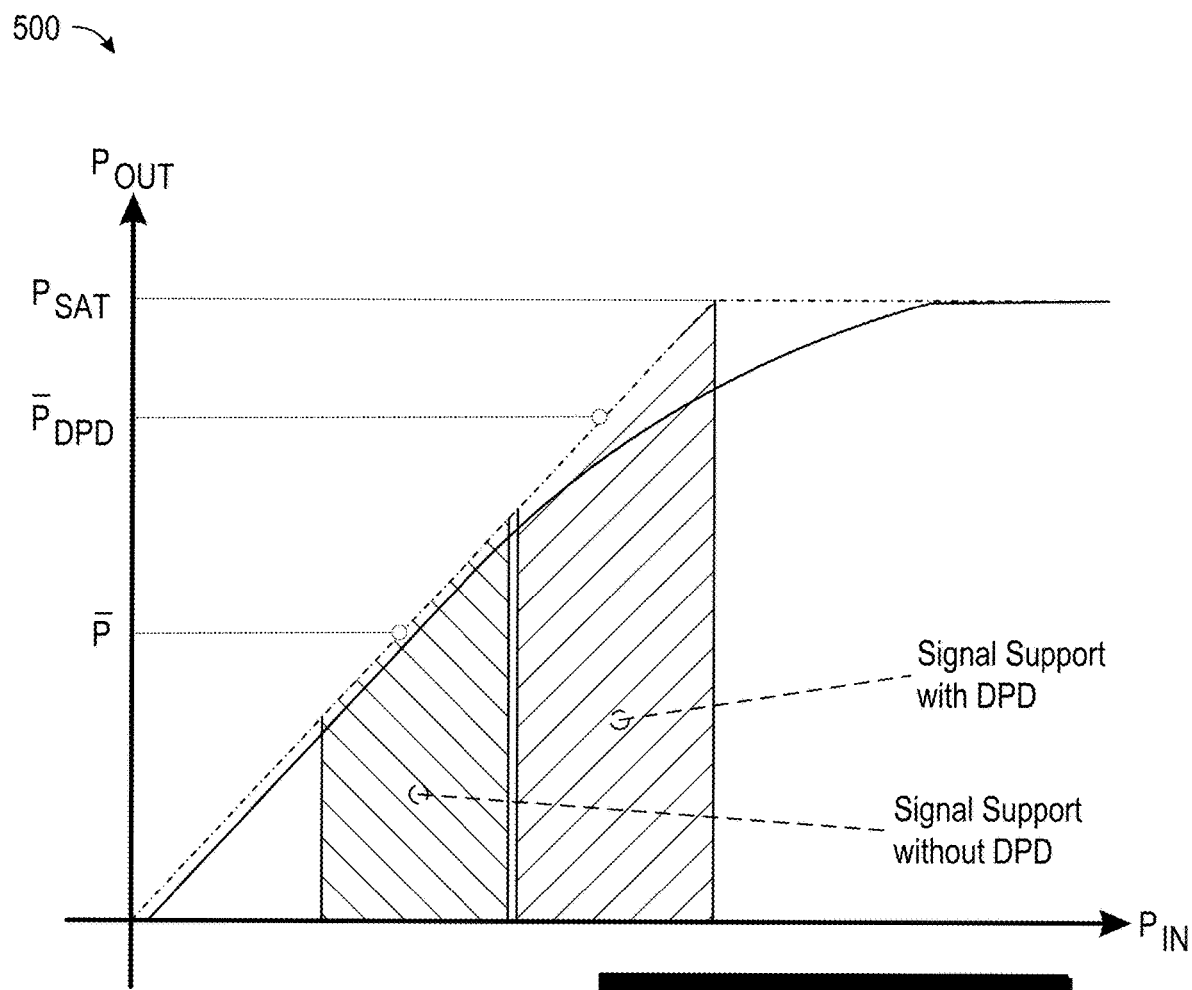
FIG. 5 depicts an example frequency response of a power amplifier (PA) with DPD and without DPD.

DPDs feature linearization capabilities and therefore improves the overall efficiency. Generally, DPD circuitry 402 adds an expanding nonlinearity in the baseband that complements compressing characteristics of the PA. The cascade of the DPD and the PA becomes linear and the original input is amplified by a constant gain. As shown in the graph 500 in FIG. 5, without DPD, the output of the PA is linear until a point after which the output of the PA is non-linear until the output reaches the saturation point, $P_{SAT}$. With DPD, the PA may be used up to $P_{SAT}$ while maintaining linearity as shown in FIG. 5 for a given input signal power, $P_{IN}$, thus increasing efficiency. The DPD may be considered as an "inverse" of the PA. $P_{DPD}$ is the average power of the signal with DPD and P is the average power of the signal without DPD.

The PA behavior should be accurately and efficiently modeled for successful DPD deployment. Some DPD techniques involve "indirect" learning of a large number of DPD coefficients. In some systems, for proper DPD performance, a non-linearity (NL) model of the PA is determined. Transmit chain 400 may include a dedicated feedback (FB) element in an RF component (e.g., RF front end) after the PA, which allows for acquisition of the NL model and calculation of the DPD coefficients. One approach for training DPD involves "backward-modeling" to model the inverse of the PA to determine coefficients and NL kernels that, when applied on the PA output, will match the PA input. Such modeling may use the following equations:

$$\underbrace{\begin{pmatrix} x(1) \\ x(2) \\ \dots \\ x(n) \end{pmatrix}}_{x} = \underbrace{\begin{pmatrix} y(1) & K_1(y(1)) & \dots & K_L(y(1)) \\ y(2) & K_1(y(2)) & \dots & K_L(y(2)) \\ \dots & \dots & \dots & \dots \\ y(n) & K_1(y(n)) & \dots & K_L(y(n)) \end{pmatrix}}_{Y} \cdot \underbrace{\begin{pmatrix} \alpha_1 \\ \alpha_2 \\ \dots \\ \alpha_L \end{pmatrix}}_{\alpha}$$

$$\alpha = \left(Y^H \cdot Y\right)^{-1} \cdot Y^H \cdot X$$

where elements of the α vector are DPD coefficients, elements of the x vector are the time domain (TD) samples of the transmitted pilot, and elements of the y vector (e.g., the first column of the Y matrix) are the TD samples at the PA output. On the transmit side, the samples may be fed back to a digital signal processor for DPD coefficient calculation. Further, Y is a matrix that consists of the non-linear kernels $K_L$ (with/without memory) (e.g., kernel $K_1$ may be $K_1(y(1))= y(1)\cdot|y(1)|^2$). Training a large number of coefficients may be impractical.

Aspects of the present disclosure provide an iterative, frequency selective, DPD. The frequency selective DPD may allow the DPD to apply different levels of non-linearity compensation per frequency band. In addition, the proposed method relies on forward modeling of the PA. The forward modeling models the PA for a given input signal. The forward modeling directly models the PA, and not the inverse of the PA. Modeling the PA may involve determining fewer NL kernels and, thereby, may be less complex and a more numerically stable approach than backward modeling. According to certain aspects, the frequency selective DPD may be used in a combined DPD/DPoD scheme. Certain aspects provide assistance signaling for the DPD/DPoD scheme.

Example Operations of Entities in a Communication Network

Figure 6:
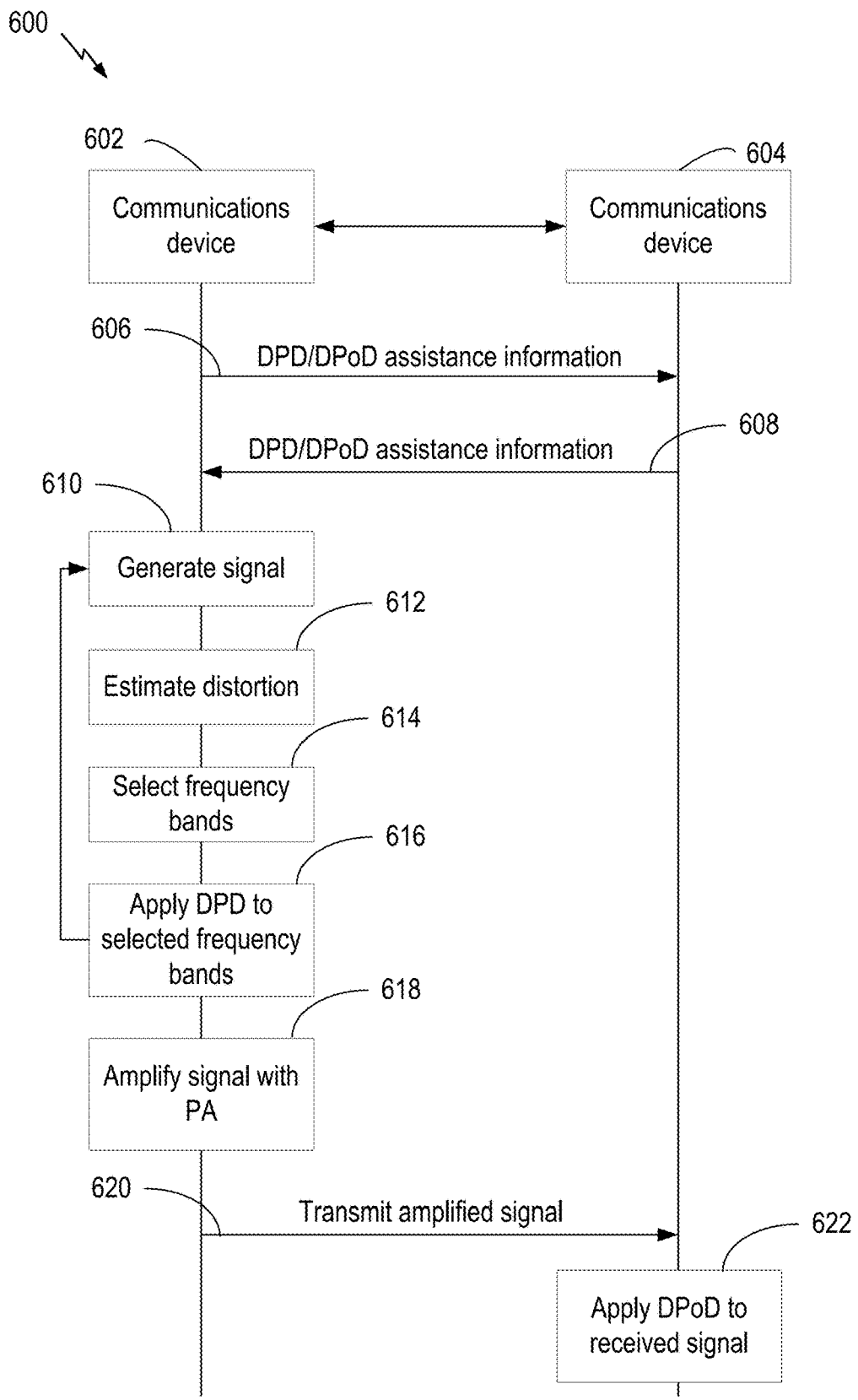
FIG. 6 depicts a process flow for communication in a network between a communications devices.

FIG. 6 depicts a process flow 600 for communication in a network between a first communications device 602 and a second communications device 604. In some aspects, the first communications device 602 may be an example of a BS 102 or a UE 104 depicted and described with respect to FIGS. 1 and 2. Similarly, the second communications device 604 may be an example of a UE 104 or a BS 102 depicted and described with respect to FIGS. 1 and 2. However, in other aspects, first communications device 602 or the second communications device 604 may be another type of network entity or network node, such as those described herein, and the second communications device 604 may be another wireless communications device, such as those described herein.

At 606, first communications device 602 sends DPD/DPoD assistance information to second communications device 604. The DPD/DPoD assistance information may assist second communications device 604 in determining a DPoD signal to apply to a signal received from first communications device 602. The DPD/DPoD assistance information may be signaled via radio resource control (RRC) signaling, medium access control (MAC) control element signaling, and/or downlink control information (DCI).

In some aspects, the DPD/DPoD assistance information at 606 includes an indication (e.g., a flag) that an effective PA model of a PA of the first communications device 602 has changed. The effective PA model may also be referred to as an effective non-linearity model. The effective PA model may be based on a crest factor reduction (CFR) stage, a DPD applied to a signal input to the PA of the first communications device 602, and/or a PA model of the PA of the first communications device 602. For example, the effective PA model may be based on the concatenation of the CFR stage, the DPD, and the PA model. The PA model may be a forward model of the PA. CFR can be applied to a signal to further reduce PAPR. In some examples, CFR circuitry clips the signal beyond a specified amplitude level (e.g., a threshold level). In some examples, the CFR circuitry uses peak windowing to scale peaks in the signal using a weighted window function. In some examples, the CFR circuitry uses a modified sigmoid transfer function to smoothen (e.g., scale and flatten) peaks in the signal. In some examples, CFR circuitry may be included before DPD circuitry in a transmit chain (e.g., such as before DPD circuitry 402 in transmit chain 400 in FIG. 4). The CFR or DPD response to a PA model may change based on a change of the PA model. The PA model may be changed based on a temperature change of the PA. The CFR or DPD be may changed when a modulation applied to the signal input to the PA has changed and/or when a maximum power reduction (MPR) value of the first communications device 602 has changed.

In some aspects, the DPD/DPoD assistance information at 606 includes a DPD capability of first communications device 602.

In some aspects, the DPD/DPoD assistance information at 606 includes the changed effective PA model. The changed effective PA model can be used by the second communications device 604 to determine a DPoD to apply (at 622).

In some aspects, the DPD/DPoD assistance information at 606 includes information that can be used to determine the changed effective PA model. For example, the DPD/DPoD assistance information at 606 may include the set of non-linearity kernels associated with the effective PA model.

In some aspects, the DPD/DPoD assistance information at 606 includes parameters associated with the DPD performed by first communications device 602. For example, the DPD/DPoD assistance information at 606 may include a Bussgang coefficient value, a distortion vector, a power scaling value, one or more NL kernels, and/or one or more frequency bands in which distortion is reduced in an output signal of the PA. The parameters are discussed in more detail below, with respect to FIG. 7A and 610-618 in FIG. 6. The indication of the one or more in-band and/or out-of-band frequency bands in which distortion is reduced is further discussed in more detail below with respect to FIGS. 8-12. In some examples, the indication includes an indication of weights associated with the DPD in the one or more frequency bands. In some examples, the frequency bands are indicated for each of a plurality of DPD iterations. The parameters associated with the DPD performed by first communications device 602 can be used by the second communications device 604 to determine a DPoD to apply (at 622).

In some aspects, the DPD/DPoD assistance information at 606 is requested by second communications device 604 and is sent by first communications device 602 in response to the request.

Although the DPD/DPoD assistance information at 606 is shown as a single communication, it should be understood that the DPD/DPoD assistance information 606 may be sent in multiple different messages or signal at different times.

At 608, second communications device 604 sends DPD/DPoD assistance information to first communications device 602. The assistance information may be signaled via RRC signaling, MAC CE signaling, and/or DCI.

In some aspects, the DPD/DPoD assistance information from second communications device 604 may include a DPoD capability of second communications device 604.

In some aspects, the DPD/DPoD assistance information may include information to assist first communications device 602 in calculating a DPD to apply. For example, the DPD/DPoD assistance information at 608 may include a Bussgang coefficient value, a distortion vector, a power scaling value, one or more NL kernels, and/or one or more frequency bands in which to reduce distortion in an output signal of the PA of first communications device 602. In some examples, the indication includes an indication of weights associated with the DPD in the one or more frequency bands. In some examples, the frequency bands are indicated for each of a plurality of DPD iterations.

Accordingly, in some aspects, first communications device 602 and second communications device 604 jointly determine or calculate the DPD and/or DPoD to be applied. Such joint determination/calculation of the DPD may allow optimization of the mitigation of the in-band and out-of-band linear distortions.

Although the DPD/DPoD assistance information at 608 is shown as a single communication in FIG. 6, it should be understood that the DPD/DPoD assistance information at 608 may be sent in multiple different messages and/or signaled at different times. Further, although the DPD/DPoD assistance information at 606 is shown before DPD/DPoD assistance information at 608, it should be understood that the DPD/DPoD assistance information from first communications device 602 may be transmitted and/or received at the same time or after the DPD/DPoD assistance information from second communications device 604.

At 610, first communications device 602 generates a signal, such as including data, control information, and/or the like, for transmission. At 612-616, first communications device 602 may perform an iterative, frequency selective, DPD on the generated signal, according to aspects of the present disclosure. The iterative, frequency selective, DPD may be described with respect to FIG. 7A.

Figure 7A:
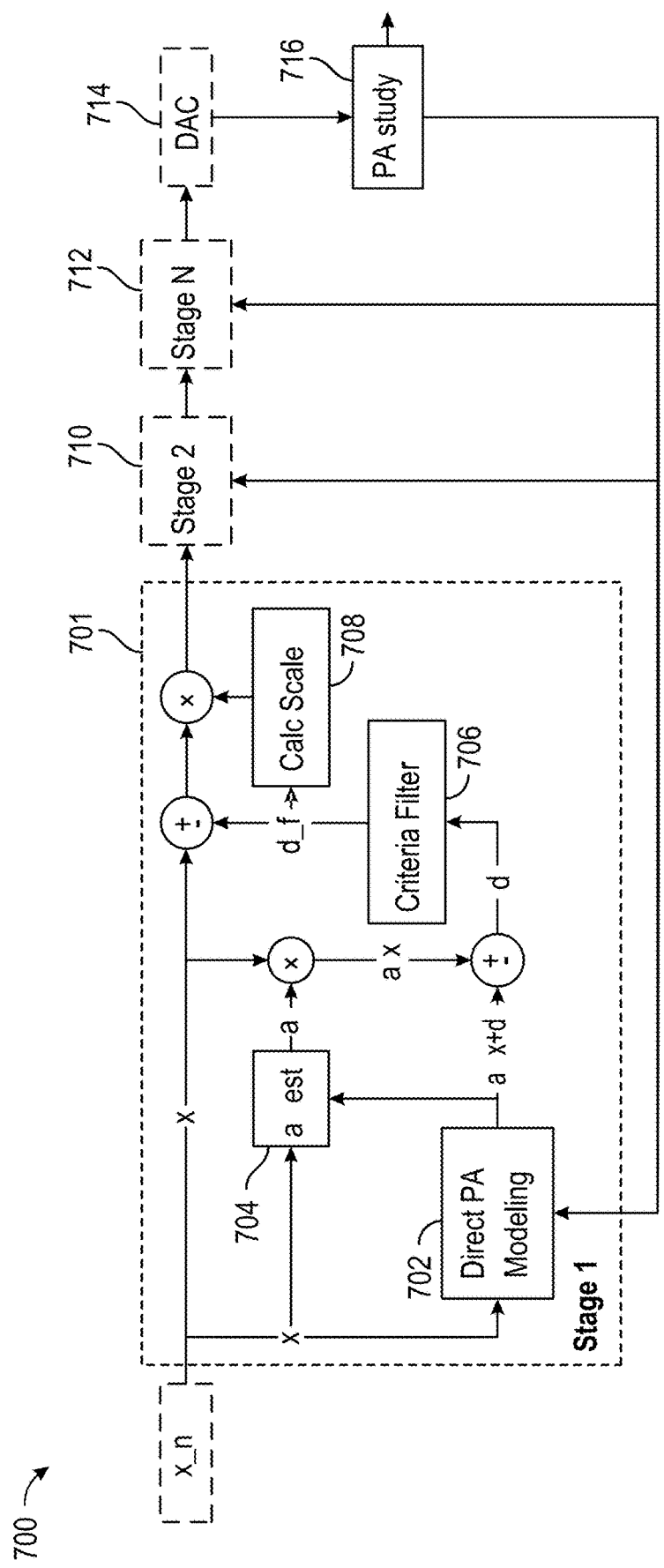
FIG. 7A depicts iterative DPD circuit stages.

At 612, first communications device 602 estimates distortion in the output from the PA. FIG. 7A depicts an iterative frequency-selective DPD circuit 700 that includes a plurality of stages 1-N. As shown, the circuit 700 includes a first stage 701, a second stage 710, up to an Nth stage 712. The circuit 700 may include more or fewer stages than shown. Components of the first stage 701 are shown in detail. Stages 710 and 712, may have similar components, though they are not shown for ease of illustration. In particular, in certain aspects, each stage is a separate set of hardware components of the DPD circuit 700. In certain aspects, one or more stages may share (e.g., re-use or be implemented by the same) hardware components. As shown in FIG. 7A, the generated signal x is input to a direct PA model 702 of the PA. In some examples, the direct PA model 702 models the PA output as a Volterra sequence. According to certain aspects, the output of the PA, y, is modeled using Bussgang decomposition according to:

$$y = PA(x) = \alpha x + d,$$

where x is the input signal to the PA, PA(x) is the signal output from the PA, α is a scaling factor called the Bussgang coefficient, and d is the non-linear distortion due to the PA.

In order remove the distortion, an additive signal, t, is found to mitigate the distortion added by the PA as:

$$\operatorname*{argmin}_{t} \|F^{H} w F(x - PA(x+t))\|^{2},$$

where, F is the frequency transform that transforms the PA model to the frequency domain, w is a diagonal weighting matrix applied to the PA model, $F^H$ is an inverse frequency transform that transforms the PA model to the time domain, and the additive signal is the value of t that minimizes the argument. $F^H wF$ allows for different weight to be applied per frequency band to the distortion mitigation. Typically, d<<x, and so a distortion created by input signal to the PA that is x−(d/α) is expected to be similar to the distortion creation created by the input signal x and, therefore, $$PA\left(x - \frac{d}{\alpha}\right) = \alpha x - d + \tilde{d} \approx \alpha x,$$

where $\tilde{d}$ is the non-linear distortion created by the input signal x−(d/α) to the PA. A Bussgang coefficient estimator 704 may estimate the Bussgang coefficient as:

$$\alpha = \frac{\sum_{n=0}^{N-1} x_n \cdot y_n^*}{\sum_{n=0}^{N-1} |x_n|^2}$$

The Bussgang coefficient α is applied to the signal x to find the additive signal d to mitigate distortion. As discussed in more detail below, by performing multiple iterations of the DPD, $\tilde{d}$ becomes closer to d, providing a better mitigation of the actual distortion created by the PA.

Referring back to FIG. 6, at 614, first communications device 602 selects one or more frequency bands to mitigate distortion in the output of the PA. As shown in FIG. 7A, at the criteria filter 706, the frequency selection may be applied to determine the frequency bands and associated weights for the frequency bands, to mitigate distortion. In some examples, the frequency bands and/or weights are selected based on where the distortion occurs. In some examples, the frequency bands and/or weights are selected based on the DPoD or DPD performed (or capability) of the other device. For example, where the transmitter knows which frequency bands the receiver will apply DPoD, the transmitter may not select those frequency bands for DPD or may select lower weights for those bands. In some examples, the frequency bands and/or weights may be preconfigured.

At 616, first communications device 602 applies the DPD to the selected frequency bands. As shown in the, FIG. 7A, the frequency-selective additive signal $d_f$ is applied to the original input signal x. A power scaler 708 may then apply a power scaling factor to the signal (x±$d_f$). In some examples, the power scaler 708 scales the signal (x±$d_f$) to match the power level of input signal x.

In some aspects, the DPD can be improved by performing the DPD iteratively. As shown in FIG. 6, after applying the DPD to the selected frequency bands, at 616, and scaling the power, the steps 612-616 can be performed iteratively. The DPD may be iteratively performed for a predefined number of iterations or a dynamically determined number of iterations. As shown in FIG. 7A, the DPD circuit 700 includes N iterative stages from stage 710 to stage 712. According to certain aspects, any or all of the parameters of each stage and the number of stages may be provided as assistance information by first communications device 602 to second communications device 604 at 606. In some aspects, each of the stages of the DPD circuit 700 may be hardware stages. In some aspects, the stages may be performed by software. As used herein, iterative DPD refers to the DPD provided by each of the series of DPD stages.

With the frequency selective DPD, the distortion can be dynamically minimized for each frequency band. For example, based on a signal-to-noise radio (SNR) of each out-of-band band, first communications device 602 sets an allowed level of distortion for the band and selects the weight to be applied to that band.

Figure 8:
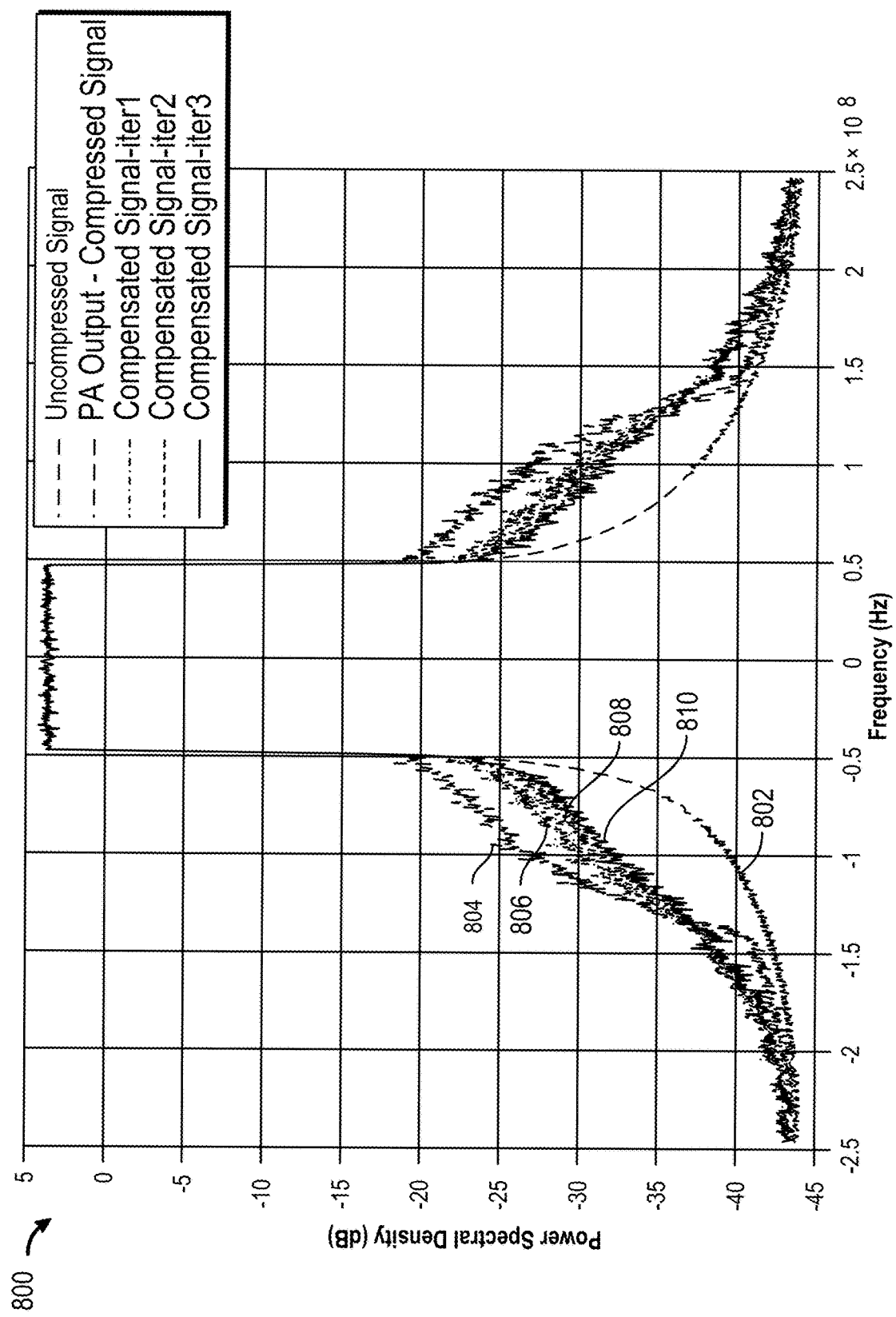
FIG. 8 depicts out-of-band power spectral density with DPD applied equally to all frequency bands.

In some aspects, first communications device 602 selects to mitigate distortion in all of the frequency band equally, both in-band and out-of-band. FIG. 8 is a graph 800 depicting out-of-band power spectral density (PSD) with DPD applied equally to all frequency bands. In FIG. 8, curve 802 shows the original input signal, curve 804 shows the signal output from the PA without any DPD, curve 806 shows the signal output from the PA after the first iteration of applying DPD to each in-band and out-of-band equally, curve 808 shows the signal output from the PA after the second iteration of applying DPD to each in-band and out-of-band equally, and curve 810 shows the signal output from the PA after the third iteration of applying DPD to each in-band and out-of-band equally. As shown in FIG. 8, the EVM improves with each iteration. In the illustrated example, the out-of-band emissions improved by 5 dB.

Figure 9:
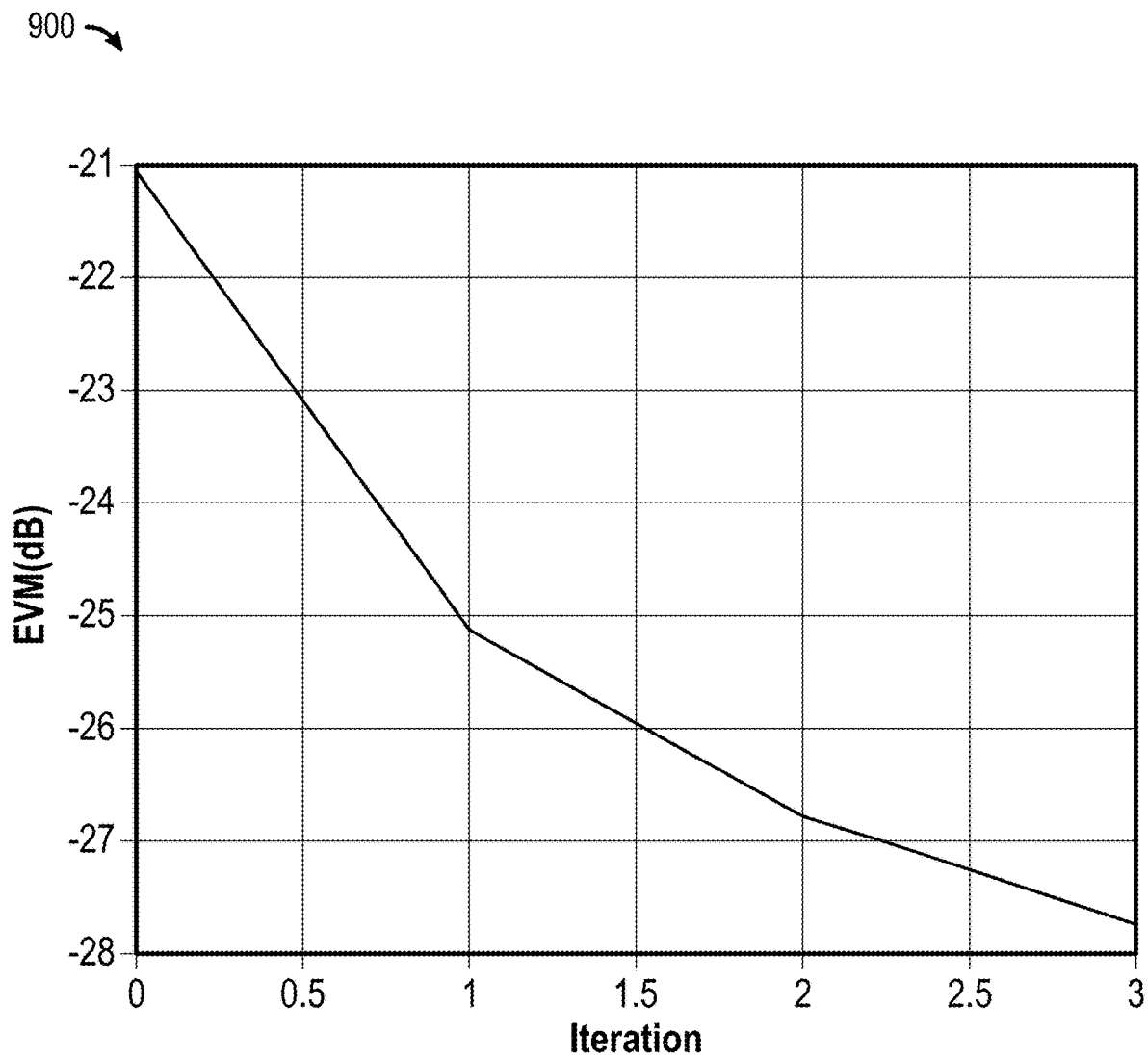
FIG. 9 depicts in-band error vector magnitude (EVM) reduction with DPD applied equally to all frequency bands.

FIG. 9 is a graph 900 depicting in-band EVM reduction with DPD applied equally to all frequency bands. As shown in FIG. 9, the EVM improves with each iteration. In the illustrated example, in-band improved from 21 dB to 28 dB.

Figure 10:
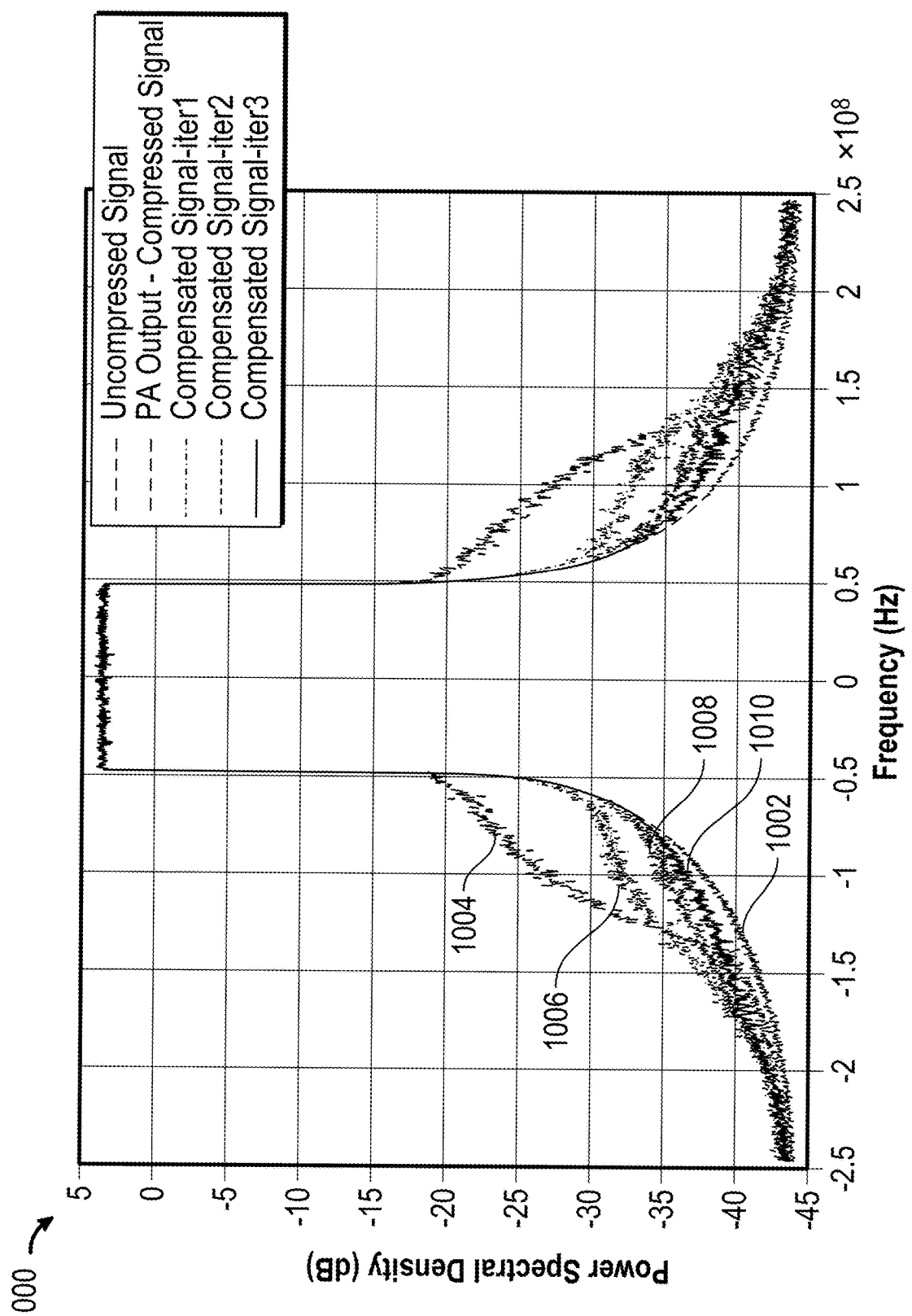
FIG. 10 depicts out-of-band power spectral density with DPD applied only to out-of-band frequencies.

In some aspects, first communications device 602 selects to mitigate distortion in only the out-of-band. FIG. 10 is a graph 1000 depicting out-of-band PSD with DPD applied only to the out-of-band frequency bands. In FIG. 10, curve 1002 shows the original input signal, curve 1004 shows the signal output from the PA without any DPD, curve 1006 shows the signal output from the PA after the first iteration of applying DPD to the out-of-band bands, curve 1008 shows the signal output from the PA after the second iteration of applying DPD to the out-of-band bands, and curve 1010 shows the signal output from the PA after the third iteration of applying DPD to the out-of-band bands. As shown in FIG. 10, the out of band emissions are reduced more than when the DPD is applied to both in-band and out-of-band bands. In the illustrated example, the out-of-band emissions improved by 15 db, a 10 db improvement over the example illustrated in FIG. 8.

Figure 11:
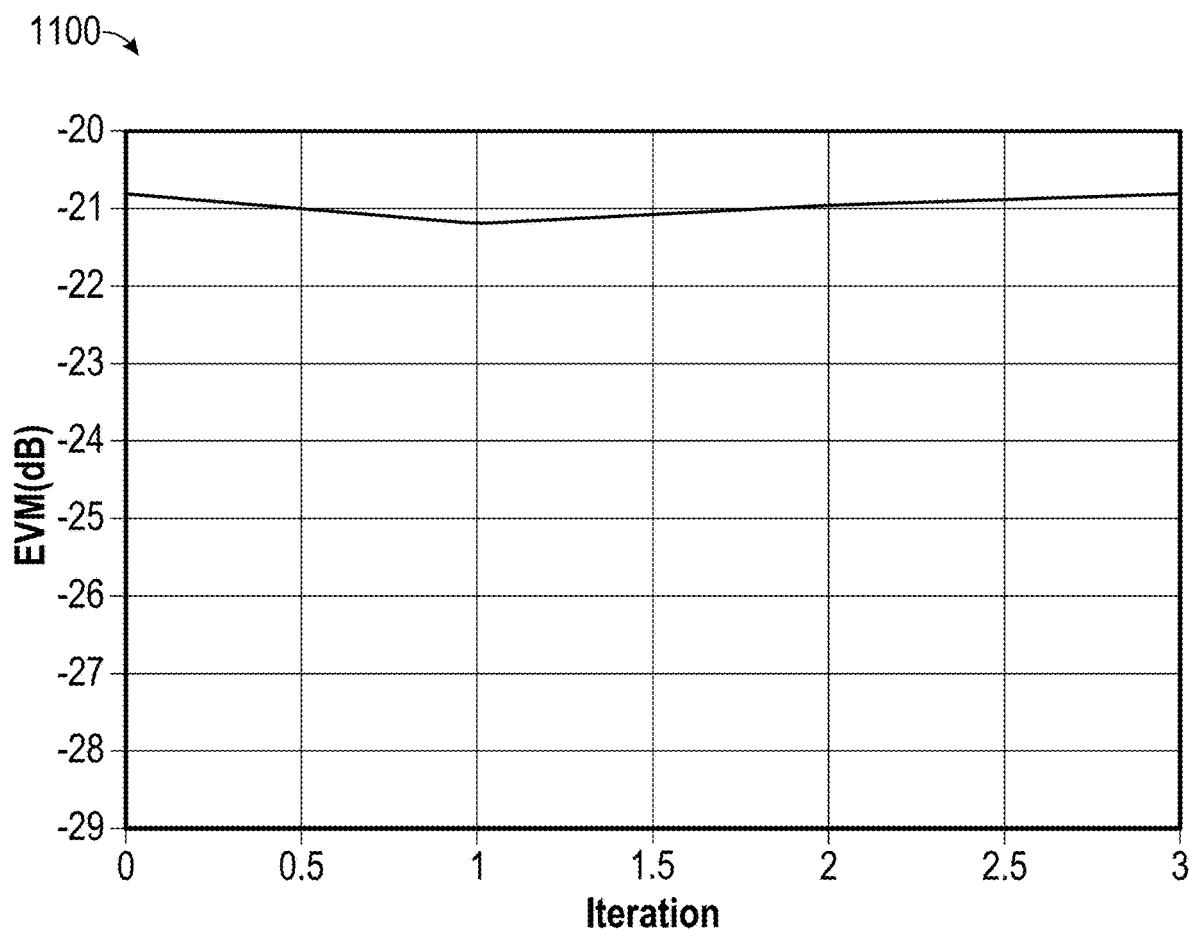
FIG. 11 depicts in-band EVM reduction with DPD applied only to out-of-band frequencies.

FIG. 11 depicts in-band EVM reduction with DPD applied only to out-of-band frequencies. As shown in FIG. 11, the EVM stays constant as the DPD is not applied to the in-band frequencies.

Figure 12:
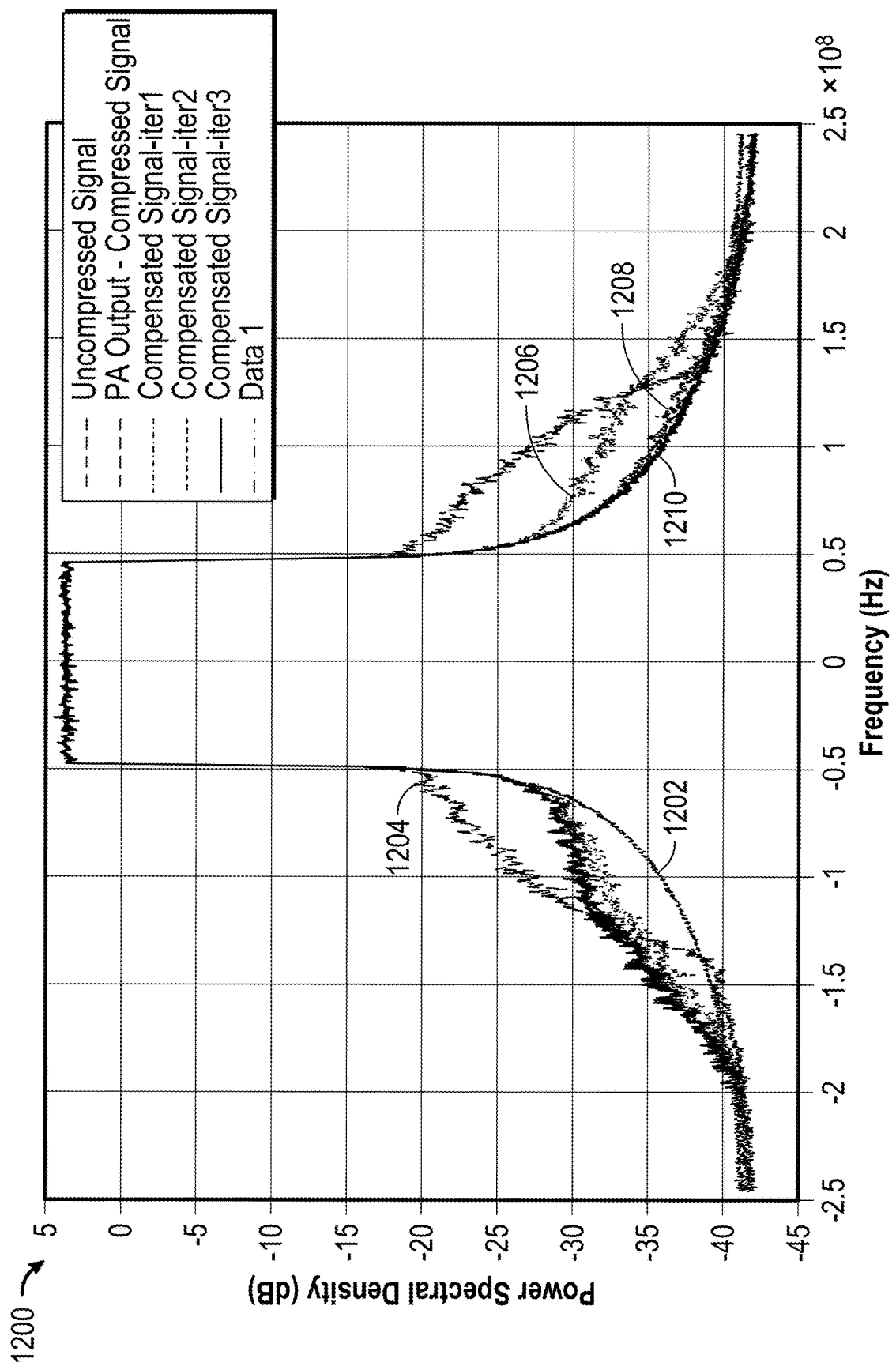
FIG. 12 depicts out-of-band power spectral density with DPD applied to different out-of-band frequencies in different DPD stages.

In some aspects, first communications device 602 selects to mitigate distortion in different bands in different iterations. FIG. 12 is a graph 1200 depicting out-of-band PSD with DPD applied to different out-of-band frequency bands in different DPD stages. In FIG. 12, curve 1202 shows the original input signal, curve 1204 shows the signal output from the PA without any DPD, curve 1206 shows the signal output from the PA after the first iteration of applying DPD to both the in-band and the out-of-band bands, curve 1208 shows the signal output from the PA after the second iteration of applying DPD to the out-of-band bands on the right side of the allocation (e.g., the bands at a higher frequency than the allocated in-bands), and curve 1210 shows the signal output from the PA after the third iteration of applying DPD to the out-of-band bands on the right side of the allocation. As shown in FIG. 12, after the third iteration, the out-of-band emissions on the right side of the allocation are equal to the input signal—that is, nearly all out of band emissions have been eliminated on the right side.

At 618, first communications device 602 amplifies the signal using the PA. As shown in FIG. 7A, after the iterative PA stages, the signal is input to digital-to-analog (DAC) converter 714 and then to PA 716.

At 620, first communications device 602 transmits the amplified signal to second communications device 604. As shown in FIG. 7A, the output of the PA may also be provided as feedback to update the PA model 702.

At 622, second communications device 604 applies DPoD to the received signal.

The combined DPD and DPoD scheme with the frequency-selective iterative DPD may allow better mitigation of non-linear distortions in signal output from the PA for improved performance. For example, the combined DPD and DPoD scheme may allow the receiver to mitigate in-band distortion with DPoD and the transmitter to focus on mitigating only out-of-band distortion with the frequency-selective iterative DPD which may allow the transmitter to better mitigate the out-of-band distortion in a dynamic manner.

Example Operations of a Transmitting Device

Figure 7B:
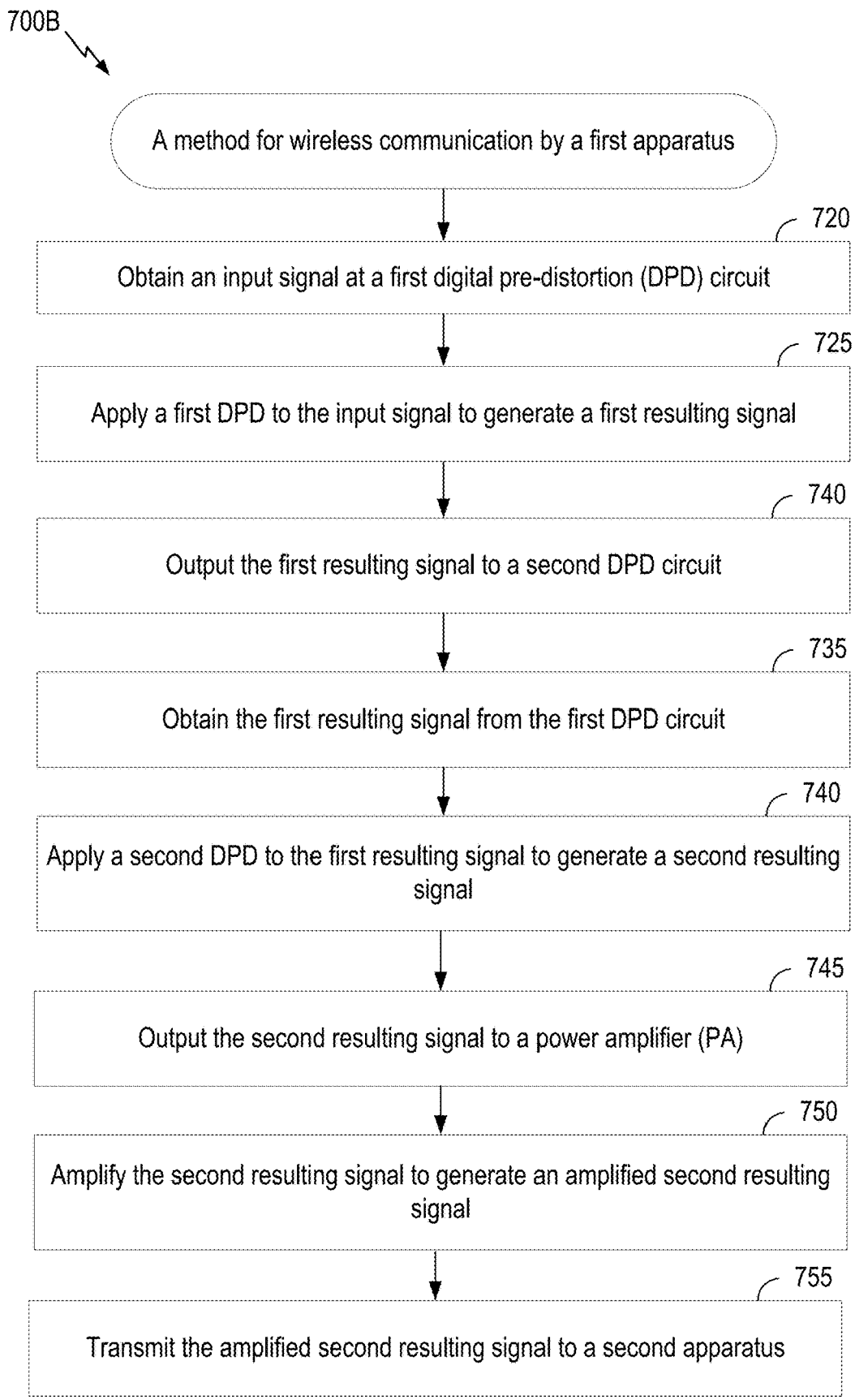
FIG. 7B depicts a method for wireless communication.

FIG. 7B shows a method 700B for wireless communication by a first apparatus, such as first communications device 602 of FIG. 6, which may be a UE 104 of FIGS. 1 and 2 or network entity, such as a BS 102 of FIGS. 1 and 2. Method 700B may be performed by first communications device 602. The method 700B may use the iterative DPD circuit 700 of FIG. 7A.

Operations 700B begin, at 720, with obtaining an input signal at a first DPD circuit. At 725, the first DPD circuit applies a first DPD to the input signal to generate a first resulting signal. At 730, the first DPD circuit outputs the first resulting signal to a second DPD circuit.

At 735, the second DPD circuit obtains the first resulting signal from the first DPD circuit. At 740, the second DPD circuit applies a second DPD to the first resulting signal to generate a second resulting signal. At 745, the second DPD circuit outputs the second resulting signal to the PA.

At 750, the PA is configured to amplify the second resulting signal to generate an amplified second resulting signal. At 755, a transmitter transmits the amplified second resulting signal to a second apparatus.

Figure 13:
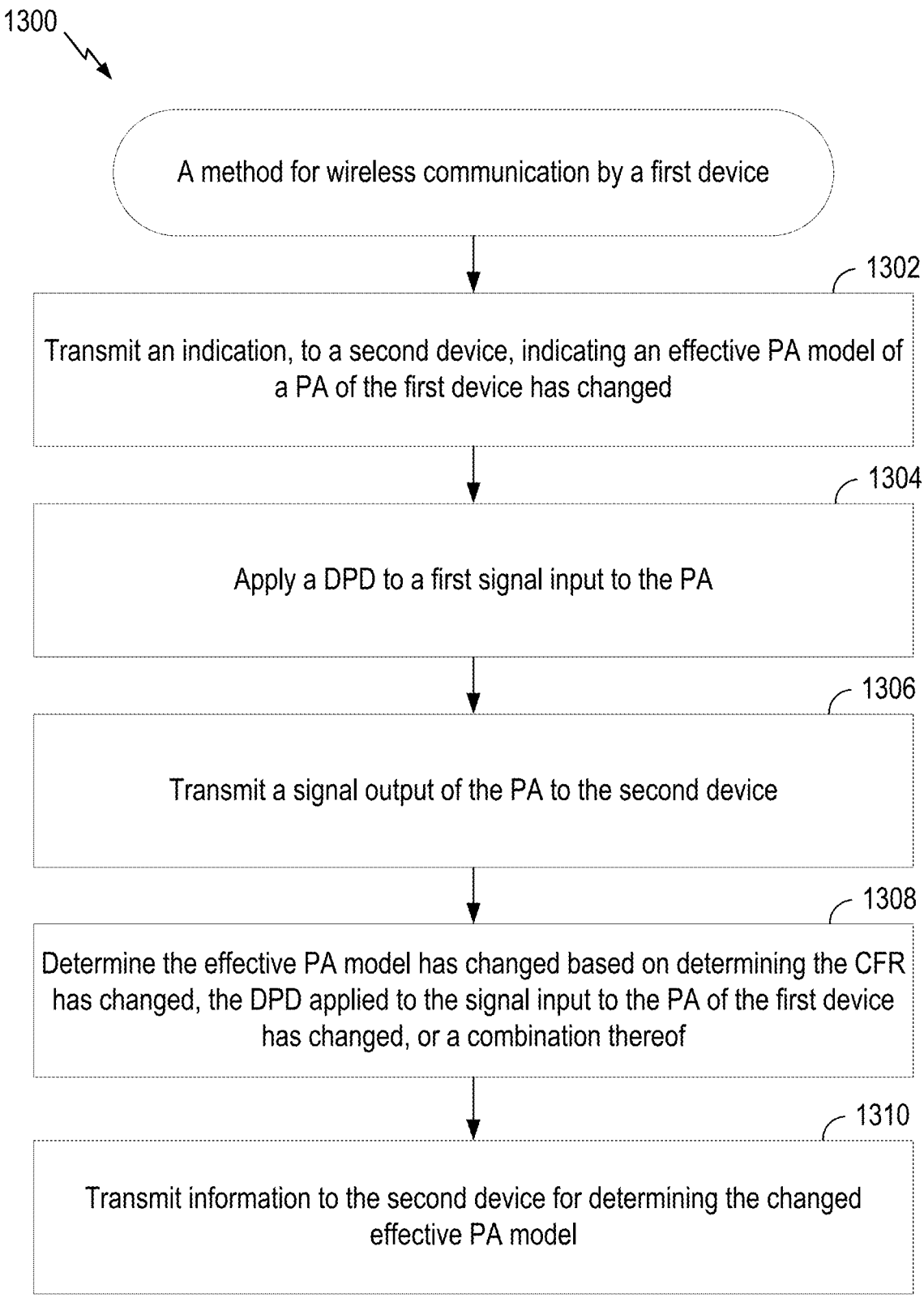
FIG. 13 depicts a method for wireless communication.

FIG. 13 shows a method 1300 for wireless communication by a first device, such as first communications device 602 of FIG. 6, which may be a UE 104 of FIGS. 1 and 2 or network entity, such as a BS 102 of FIGS. 1 and 2. Method 1300 may be performed by first communications device 602.

Method 1300 begins at 1302 with FIG. 13 shows a method 1300 for wireless communication by a first device, such as first communications device 602 of FIG. 6, which may be a UE 104 of FIGS. 1 and 2 or network entity, such as a BS 102 of FIGS. 1 and 2. Method 1300 may be performed by first communications device 602.

Method 1300 begins at 1302 with transmitting an indication, to a second device, indicating an effective PA model of a PA of the first device has changed.

Method 1300 then proceeds to step 1304 with applying a DPD to a first signal input to the PA. The DPD is based on the effective PA model that has changed.

Method 1300 then proceeds to step 1306 with transmitting a signal output of the PA to the second device.

Various aspects relate to the method 1300, including the following aspects.

In one aspect, the effective PA model is a CFR, a DPD applied to a signal input to the PA of the first device, and a PA model of the PA of the first device. In one aspect, method 1300 further includes, at step 1308, determining the effective PA model has changed based on determining the CFR has changed, the DPD applied to the signal input to the PA of the first device has changed, or a combination thereof.

In one aspect, determining the CFR or DPD has changed comprises determining a temperature change of the PA, a modulation applied to the signal input to the PA has changed, a maximum power reduction (MPR) value of the first device has changed, or a combination thereof.

In one aspect, method 1300 further includes signaling a DPD capability of the first device to the second device. In one aspect, method 1300 further includes receiving signaling indicating a DPoD capability of the second device.

In one aspect, method 1300 further includes, at 1310, transmitting information to the second device for determining the changed effective PA model.

In one aspect, the information comprises a set of nonlinearity kernels associated with the effective PA model. In one aspect, the information comprises the changed effective PA model. In one aspect, the information comprises a Bussgang coefficient value, a distortion value, a power scaling value, or a combination thereof.

In one aspect, the information comprises an indication of one or more frequency bands in which distortion is reduced in an output signal of the PA. In one aspect, the indication of the one or more frequency bands comprises a plurality of weights and a plurality of frequency bands to which the plurality of weights are applied.

In one aspect, the PA model is used iteratively to determine the DPD to apply to an input signal to the PA, and wherein the indication of the one or more frequency bands comprises an indication, per iteration, of one or more frequency bands in which distortion in the output signal of the PA is reduced. In one aspect, the indication of the one or more frequency bands comprises an indication, for each iteration, of all in-band and out-of-band frequency bands of the output signal of the PA. In one aspect, the indication of the one or more frequency bands comprises an indication, for each iteration, of only out-of-band frequency bands of the output signal of the PA. In one aspect, the indication of the one or more frequency bands comprises an indication, for a first one or more iterations, of only out-of-band frequency bands of the output signal of the PA and, for a second one or more iterations, of only in-band frequency bands of the output signal of the PA. In one aspect, the indication of the one or more frequency bands comprises, for a first one or more iterations, an indication of a first one or more out-of-band frequency bands of the output signal of the PA and, for a second one or more iterations, of a second one or more out-of-band frequency bands of the output signal of the PA. In one aspect, the PA model is used iteratively to determine the DPD to apply to an input signal to the PA, and wherein the information comprises a number of the iterations.

In one aspect, the method 1300 further includes receiving information from the second device for determining the changed effective PA model.

Figure 15:
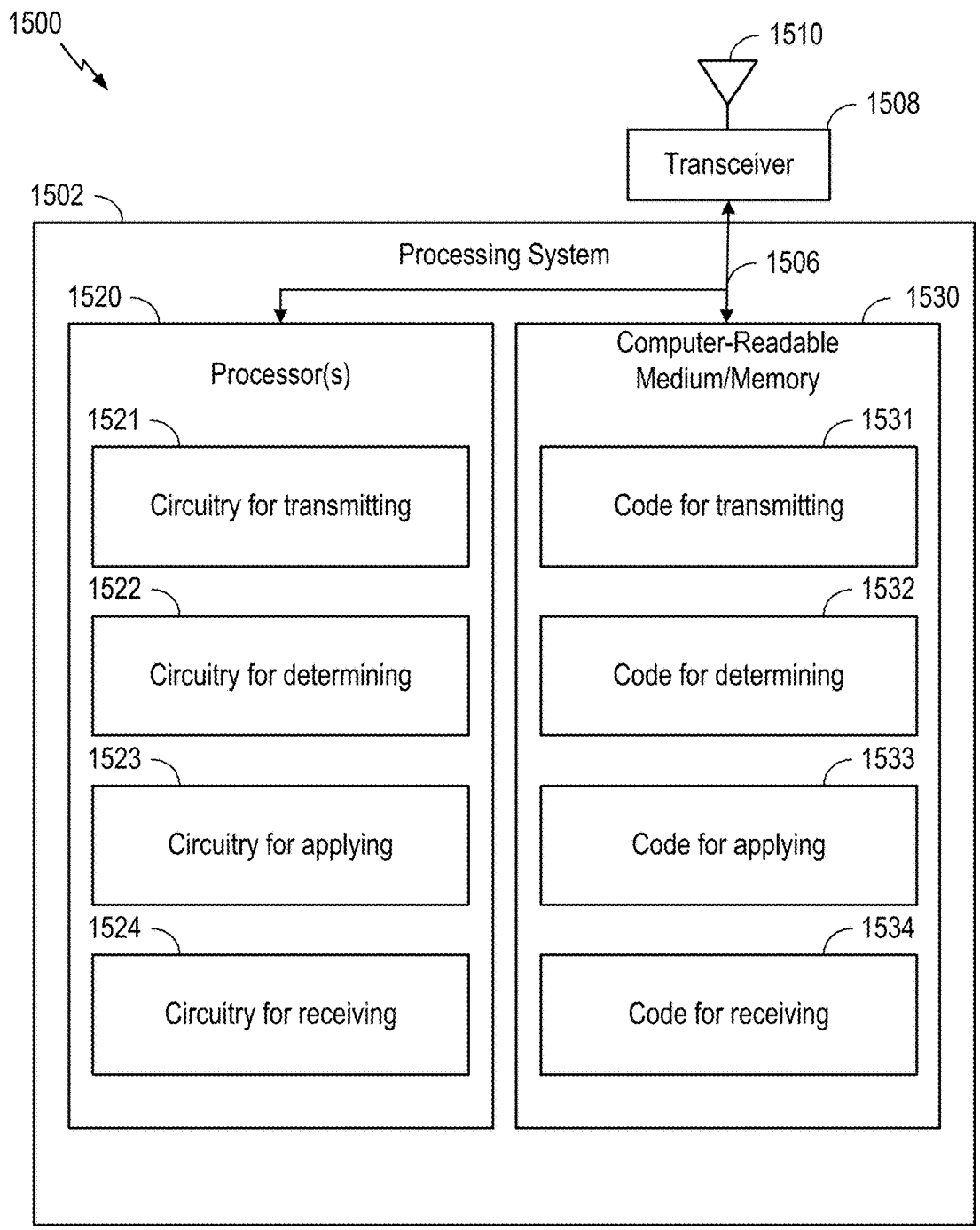
FIG. 15 depicts aspects of an example communications device.

In one aspect, method 1300, or any aspect related to method 1300, may be performed by an apparatus, such as communications device 1500 of FIG. 15, which includes various components operable, configured, or adapted to perform the method 1300. Communications device 1500 is described below in further detail.

Note that FIG. 13 is just one example of a method, and other methods including fewer, additional, or alternative steps are possible consistent with this disclosure.

Example Operations of a Receiving Device

Figure 14:
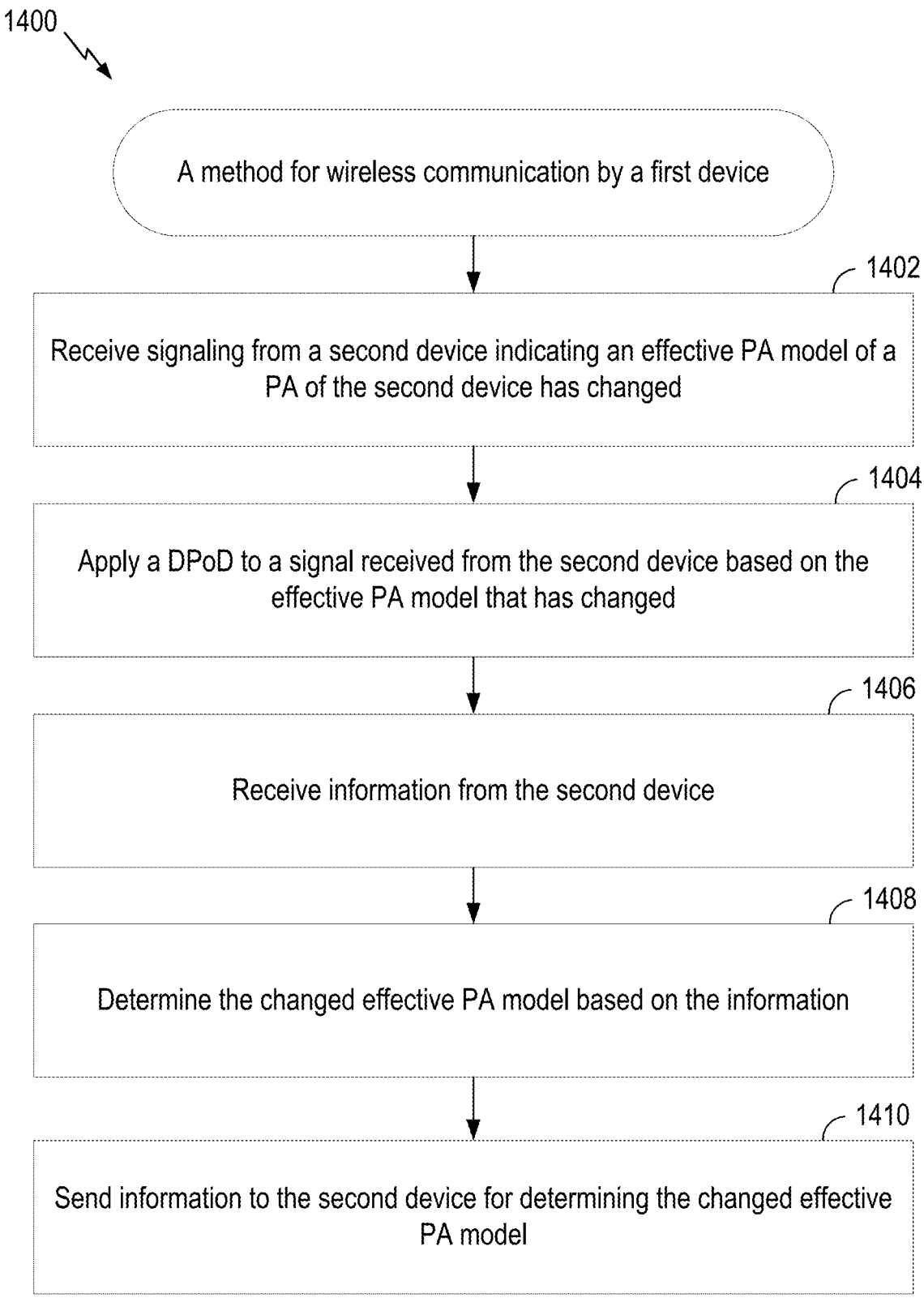
FIG. 14 depicts a method for wireless communication.

FIG. 14 shows a method 1400 for wireless communication by a receiving device, such as second communications device 604 of FIG. 6 which may be a UE 104 of FIGS. 1 and 2 or network entity, such as BS 102 of FIGS. 1 and 2. Method 1400 may be performed by second communications device 604.

Method 1400 begins at 1402 with receiving signaling from a second device indicating an effective PA model of a PA of the second device has changed.

Method 1400 then proceeds to step 1404 with applying a DPoD to a signal received from the second device based on the effective PA model that has changed.

Various aspects relate to the method 1400, including the following aspects.

In one aspect, the effective PA model comprises a CFR, a DPD applied to a signal input to the PA of the second device, and a PA model of the PA of the second device. In one aspect, the indication the effective PA model has changed comprises an indication the CFR has changed, the DPD applied to the signal input to the PA of the second device has changed, or a combination thereof. In one aspect, the indication the CFR or DPD has changed comprises an indication of a temperature change of the PA, a modulation applied to the signal input to the PA has changed, a MPR value of the second device has changed, or a combination thereof.

In one aspect, method 1400 further includes receiving signaling of a DPD capability of the second device.

In one aspect, method 1400 further includes sending signaling to the second device indicating a DPoD capability of the first device.

In one aspect, method 1400 further includes, at 1406, receiving information from the second device and, at 1408 determining the changed effective PA model based on the information.

In one aspect, the information comprises a set of nonlinearity kernels associated with the effective PA model. In one aspect, the information comprises the changed effective PA model. In one aspect, the information comprises a Bussgang coefficient value, a distortion value, a power scaling value, or a combination thereof.

In one aspect, the information comprises an indication of one or more frequency bands in which distortion is reduced in an output signal of the PA. In one aspect, the indication of the one or more frequency bands comprises a plurality of weights and a plurality of frequency bands to which the plurality of weights are applied.

In one aspect, the PA model is used iteratively to determine the DPD to apply to an input signal to the PA, and wherein the indication of the one or more frequency bands comprises an indication, per iteration, of one or more frequency bands in which distortion in the output signal of the PA is reduced. In one aspect, the indication of the one or more frequency bands comprises an indication, for each iteration, of all in-band and out-of-band frequency bands of the output signal of the PA. In one aspect, the indication of the one or more frequency bands comprises an indication, for each iteration, of only out-of-band frequency bands of the output signal of the PA. In one aspect, the indication of the one or more frequency bands comprises an indication, for a first one or more iterations, of only out-of-band frequency bands of the output signal of the PA and, for a second one or more iterations, of only in-band frequency bands of the output signal of the PA. In one aspect, the indication of the one or more frequency bands comprises, for a first one or more iterations, an indication of a first one or more out-of-band frequency bands of the output signal of the PA and, for a second one or more iterations, of a second one or more out-of-band frequency bands of the output signal of the PA. In one aspect, the PA model is used iteratively to determine the DPD to apply to an input signal to the PA, and the information comprises a number of the iterations.

In one aspect, method 1400 further includes, at 1410, sending information to the second device for determining the changed effective PA model.

Figure 16:
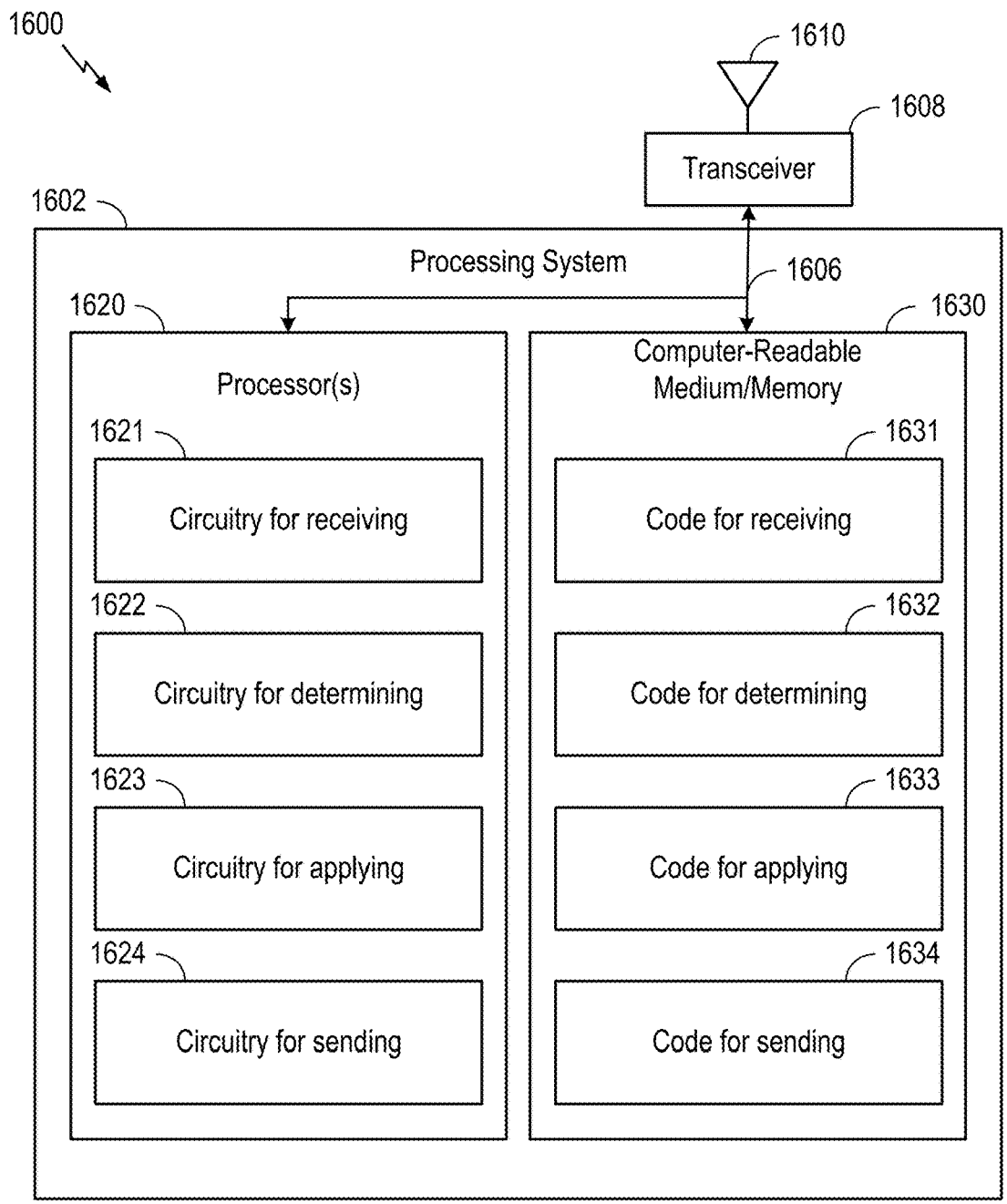
FIG. 16 depicts aspects of an example communications device.

In one aspect, method 1400, or any aspect related to method 1400, may be performed by an apparatus, such as communications device 1600 of FIG. 16, which includes various components operable, configured, or adapted to perform the method 1400. Communications device 1600 is described below in further detail.

Note that FIG. 14 is just one example of a method, and other methods including fewer, additional, or alternative steps are possible consistent with this disclosure.

Example Communication Devices

FIG. 15 depicts aspects of an example communications device 1500. In some aspects, communications device 1500 is a user equipment, such as UE 104 described above with respect to FIGS. 1 and 2 or network entity, such as BS 102 of FIGS. 1 and 2.

The communications device 1500 includes a processing system 1502 coupled to a transceiver 1508 (e.g., a transmitter and/or a receiver). The transceiver 1508 is configured to transmit and receive signals for the communications device 1500 via an antenna 1510, such as the various signals as described herein. The processing system 1502 may be configured to perform processing functions for the communications device 1500, including processing signals received and/or to be transmitted by the communications device 1500.

The processing system 1502 includes one or more processors 1520. In various aspects, the one or more processors 1520 may be representative of one or more of receive processor 258, transmit processor 264, TX MIMO processor 266, and/or controller/processor 280, as described with respect to FIG. 2. In various aspects, one or more processors 1620 may be representative of one or more of receive processor 238, transmit processor 220, TX MIMO processor 230, and/or controller/processor 240, as described with respect to FIG. 2. The one or more processors 1520 are coupled to a computer-readable medium/memory 1530 via a bus 1506. In certain aspects, the computer-readable medium/memory 1530 is configured to store instructions (e.g., computer-executable code) that when executed by the one or more processors 1520, cause the one or more processors 1520 to perform the method 1300 described with respect to FIG. 13, or any aspect related to method 1300. Note that reference to a processor performing a function of communications device 1500 may include one or more processors performing that function of communications device 1500.

In the depicted example, computer-readable medium/memory 1530 stores code (e.g., executable instructions) 1531 for transmitting, 1532 for determining, 1533 or applying, and/or 1534 for receiving. Processing of the code 1531-1534 may cause the communication device 1500 to perform the method 1300 described with respect to FIG. 13, or any aspect related to method 1300.

The one or more processors 1520 include circuitry configured to implement (e.g., execute) the code stored in the computer-readable medium/memory 1530, including circuitry 1521 for transmitting, circuitry 1522 for determining, circuitry 1523 for applying, and/or circuitry 1524 for receiving. Processing with circuitry 1521-1524 may cause the communication device 1500 to perform the method 1300 described with respect to FIG. 13, or any aspect related to method 1300.

Various components of the communications device 1500 may provide means for performing the method 1300 described with respect to FIG. 13, or any aspect related to method 1300. For example, means for transmitting, sending or outputting for transmission may include the transceivers 254 and/or antenna(s) 252 of the UE 104 illustrated in FIG. 2, the transceivers 232 and/or antenna(s) 234 of the BS 102 illustrated in FIG. 2, and/or transceiver 1508 and antenna 1510 of the communication device 1500. Means for receiving or obtaining may include the transceivers 254 and/or antenna(s) 252 of the UE 104 illustrated in FIG. 2, the transceivers 232 and/or antenna(s) 234 of the BS 102 illustrated in FIG. 2, and/or transceiver 1508 and antenna 1510 of the communication device 1500.

FIG. 16 depicts aspects of an example communications device. In some aspects, communications device 1600 is a user equipment, such as UE 104 described above with respect to FIGS. 1 and 2 or a network entity, such as BS 102 of FIGS. 1 and 2.

The communications device 1600 includes a processing system 1602 coupled to a transceiver 1608 (e.g., a transmitter and/or a receiver). The transceiver 1608 is configured to transmit and receive signals for the communications device 1600 via an antenna 1610, such as the various signals as described herein. The processing system 1602 may be configured to perform processing functions for the communications device 1600, including processing signals received and/or to be transmitted by the communications device 1600.

The processing system 1602 includes one or more processors 1620. In various aspects, the one or more processors 1520 may be representative of one or more of receive processor 258, transmit processor 264, TX MIMO processor 266, and/or controller/processor 280, as described with respect to FIG. 2. In various aspects, one or more processors 1620 may be representative of one or more of receive processor 238, transmit processor 220, TX MIMO processor 230, and/or controller/processor 240, as described with respect to FIG. 2. The one or more processors 1620 are coupled to a computer-readable medium/memory 1630 via a bus 1606. In certain aspects, the computer-readable medium/memory 1630 is configured to store instructions (e.g., computer-executable code) that when executed by the one or more processors 1620, cause the one or more processors 1620 to perform the method 1400 described with respect to FIG. 14, or any aspect related to method 1400. Note that reference to a processor of communications device 1600 performing a function may include one or more processors of communications device 1600 performing that function.

In the depicted example, the computer-readable medium/memory 1630 stores code (e.g., executable instructions) 1631 for receiving, code 1632 for determining, code 1633 for applying, and/or code 1634 for sending. Processing of the code 1631-1634 may cause the communication device 1600 to perform the method 1400 described with respect to FIG. 14, or any aspect related to method 1400.

The one or more processors 1620 include circuitry configured to implement (e.g., execute) the code stored in the computer-readable medium/memory 1630, including circuitry 1621 for receiving, circuitry 1622 for determining, circuitry 1623 for applying, and/or circuitry 1624 for sending. Processing with circuitry 1621-1624 may cause the communication device 1600 to perform the method 1400 as described with respect to FIG. 14, or any aspect related to method 1400.

Various components of the communications device 1600 may provide means for performing the method 1400 as described with respect to FIG. 14, or any aspect related to method 1400. For example, means for transmitting, sending or outputting for transmission may include the transceivers 254 and/or antenna(s) 252 of the UE 104 illustrated in FIG. 2, the transceivers 232 and/or antenna(s) 234 of the BS 102 illustrated in FIG. 2, and/or transceiver 1608 and antenna 1610 of the communication device 1600. Means for receiving or obtaining may include the transceivers 254 and/or antenna(s) 252 of the UE 104 illustrated in FIG. 2, the transceivers 232 and/or antenna(s) 234 of the BS 102 illustrated in FIG. 2, and/or transceiver 1608 and antenna 1610 of the communication device 1600.

EXAMPLE CLAUSES

Implementation examples are described in the following numbered clauses:

Clause 1: An apparatus for wireless communication, comprising: a power amplifier (PA); a first digital pre-distortion (DPD) circuit configured to: obtain an input signal; apply a first DPD to the input signal to generate a first resulting signal; and output the first resulting signal to a second DPD circuit; the second DPD circuit configured to: obtain the first resulting signal from the first DPD circuit; apply a second DPD to the first resulting signal to generate a second resulting signal; and output the second resulting signal to the PA, wherein the PA is configured to amplify the second resulting signal to generate an amplified second resulting signal; and a transmitter configured to transmit the amplified second resulting signal to a second apparatus.

Clause 2: The apparatus of clause 1, wherein the apparatus comprises one or more DPD circuits before the first DPD circuit, each of the one or more DPD circuits configured to: obtain a signal; apply a DPD to the signal to generate a resulting signal; and output the resulting signal to a next DPD circuit. One of the one or more DPD circuits is configured to output the resulting signal as the input signal to the first DPD circuit.

Clause 3: The apparatus of any combination of clauses 1-2, wherein the first DPD circuit is configured to: determine an output of the PA based on a model of the PA and the input signal; determine a distortion of the output of the PA; and apply the first DPD based on the distortion.

Clause 4: The apparatus of clause 3, wherein the output of the PA comprises a sum of a Bussgang coefficient applied to the input signal and a signal distortion value.

Clause 5: The apparatus of any combination of clauses 3-4, wherein the second DPD circuit is configured to: determine a second output of the PA based on the model of the PA and the first resulting signal; determine a second distortion of the second output of the PA; and apply the second DPD based on the second distortion.

Clause 6: The apparatus of any combination of clauses 3-6, wherein the model of the PA uses a Volterra sequence to model the output of the PA.

Clause 7: The apparatus any combination of clauses 1-6, wherein the first DPD circuit is further configured to apply a power scaling to the input signal such that a power level of the first resulting signal is equal to a power level of the input signal.

Clause 8: The apparatus of any combination of clauses 1-7, wherein the first DPD circuit is further configured to: select one or more frequencies in which to reduce distortion in the input signal; and apply the first DPD to reduce distortion at the one or more frequencies.

Clause 9: The apparatus of clause 8, wherein the first DPD circuit is configured to select a plurality of weights to apply the first DPD to reduce distortion at the selected one or more frequencies.

Clause 10: The apparatus of any combination of clauses 8-9, wherein the first DPD circuit is configured to select all in-band and out-of-band frequencies of the input signal.

Clause 11: The apparatus of any combination of clauses 8-19, wherein the first DPD circuit is configured to select only out-of-band frequencies of the input signal.

Clause 12: The apparatus of any combination of clauses 8-11, wherein the first DPD circuit is configured to select a first one or more out-of-band frequencies of the input signal and the second DPD circuit is configured select a second one or more out-of-band frequencies of the input signal.

Clause 13: The apparatus of any combination of clauses 8-12, wherein the first DPD circuit is configured to select a first one or more out-of-band frequencies of the input signal and the second DPD circuit is configured to select a second one or more in-band frequencies of the input signal.

Clause 14: A method for wireless communication by a first device, comprising: transmitting an indication, to a second device, indicating an effective power amplifier (PA) model of a PA of the first device has changed; applying a digital pre-distortion (DPD) to a first signal input to the PA, wherein the DPD is based on the effective PA model that has changed; and transmitting a signal output of the PA to the second device.

Clause 15: The method of clause 14, wherein the effective PA model comprises a crest factor reduction (CFR), a second DPD applied to a second signal input to the PA of the first device, and a PA model of the PA of the first device.

Clause 16: The method of clause 15, further comprising determining the effective PA model has changed based on determining the CFR has changed, the second DPD applied to the second signal input to the PA of the first device has changed, or a combination thereof Clause 17: The method of clause 16, wherein determining the CFR or the second DPD has changed comprises determining a temperature change of the PA, a modulation applied to the second signal input to the PA has changed, a maximum power reduction (MPR) value of the first device has changed, or a combination thereof.

Clause 18: The method of any combination of clauses 14-17, further comprising signaling a DPD capability of the first device to the second device.

Clause 19: The method of any combination of clauses 14-18, further comprising receiving signaling indicating a digital post-distortion (DPoD) capability of the second device.

Clause 20: The method of any combination of clauses 14-19, further comprising transmitting information to the second device for determining the effective PA model that changed.

Clause 21: The method of clause 20, wherein the information comprises a set of non-linearity kernels associated with the effective PA model.

Clause 22: The method of any combination of clauses 20-21, wherein the information comprises the changed effective PA model that changed.

Clause 23: The method of any combination of clauses 20-22, wherein the information comprises a Bussgang coefficient value, a distortion value, a power scaling value, or a combination thereof.

Clause 24: The method of any combination of clauses 20-23, wherein the information comprises an indication of one or more frequency bands in which distortion is reduced in an output signal of the PA.

Clause 25: The method of claim 24, wherein the indication of the one or more frequency bands comprises a plurality of weights and a plurality of frequency bands to which the plurality of weights are applied.

Clause 26: The method of any combination of clauses 24-25, further comprising iteratively determining the DPD to apply to the first signal input to the PA based on the effective PA model, wherein the indication of the one or more frequency bands comprises an indication, per iteration, of one or more frequency bands in which distortion in the output signal of the PA is reduced.

Clause 27: The method of clause 26, wherein the indication of the one or more frequency bands comprises an indication, for each iteration, of all in-band and out-of-band frequency bands of the output signal of the PA.

Clause 28: The method of any combination of clauses 26-27, wherein the indication of the one or more frequency bands comprises an indication, for each iteration, of only out-of-band frequency bands of the output signal of the PA.

Clause 29: The method of any combination of clauses 26-28, wherein the indication of the one or more frequency bands comprises an indication, for a first one or more iterations, of only out-of-band frequency bands of the output signal of the PA and, for a second one or more iterations, of only in-band frequency bands of the output signal of the PA.

Clause 30: The method of any combination of clauses 26-29, wherein the indication of the one or more frequency bands comprises, for a first one or more iterations, an indication of a first one or more out-of-band frequency bands of the output signal of the PA and, for a second one or more iterations, of a second one or more out-of-band frequency bands of the output signal of the PA.

Clause 31: The method of any combination of clauses 20-30, further comprising iteratively determining the DPD to apply to the first signal input to the PA based on the effective PA model, wherein the information comprises a number of the iterations Clause 32: The method of any combination of clauses 14-31, further comprising receiving information from the second device for determining the effective PA model that changed.

Clause 33: A method for wireless communication by a first device, comprising: receiving signaling from a second device indicating an effective power amplifier (PA) model of a PA of the second device has changed; and applying a digital post-distortion (DPoD) to a signal received from the second device based on the effective PA model that has changed.

Clause 34: The method of clause 33, wherein the effective PA model comprises a crest factor reduction (CFR), a digital pre-distortion (DPD) applied to a signal input to the PA of the second device, and a PA model of the PA of the second device.

Clause 35: The method of clause 34, wherein the indication the effective PA model has changed comprises an indication the CFR has changed, the DPD applied to the signal input to the PA of the second device has changed, or a combination thereof.

Clause 36: The method of clause 35, wherein the indication the CFR or DPD has changed comprises an indication of a temperature change of the PA, a modulation applied to the signal input to the PA has changed, a maximum power reduction (MPR) value of the second device has changed, or a combination thereof.

Clause 37: The method of any combination of clauses 33-36, further comprising receiving signaling of a DPD capability of the second device.

Clause 38: The method of any combination of clauses 33-37, further comprising sending signaling to the second device indicating a DPoD capability of the first device.

Clause 39: The method of any combination of clauses 33-38, further comprising: receiving information from the second device; and determining the changed effective PA model based on the information.

Clause 40: The method of claim 39, wherein the information comprises a set of non-linearity kernels associated with the effective PA model.

Clause 41: The method of any combination of clauses 39-40, wherein the information comprises the changed effective PA model.

Clause 42: The method of any combination of clauses 39-41, wherein the information comprises a Bussgang coefficient value, a distortion value, a power scaling value, or a combination thereof.

Clause 43: The method of any combination of clauses 39-42, wherein the information comprises an indication of one or more frequency bands in which distortion is reduced in an output signal of the PA.

Clause 44: The method of clause 43, wherein the indication of the one or more frequency bands comprises a plurality of weights and a plurality of frequency bands to which the plurality of weights are applied.

Clause 45: The method of any combination of clauses 43-44, wherein the PA model is used iteratively to determine the DPD to apply to an input signal to the PA, and wherein the indication of the one or more frequency bands comprises an indication, per iteration, of one or more frequency bands in which distortion in the output signal of the PA is reduced.

Clause 46: The method of clause 45, wherein the indication of the one or more frequency bands comprises an indication, for each iteration, of all in-band and out-of-band frequency bands of the output signal of the PA.

Clause 47: The method of any combination of clauses 45-46, wherein the indication of the one or more frequency bands comprises an indication, for each iteration, of only out-of-band frequency bands of the output signal of the PA.

Clause 48: The method of any combination of clauses 45-47, wherein the indication of the one or more frequency bands comprises an indication, for a first one or more iterations, of only out-of-band frequency bands of the output signal of the PA and, for a second one or more iterations, of only in-band frequency bands of the output signal of the PA.

Clause 49: The method of any combination of clauses 45-48, wherein the indication of the one or more frequency bands comprises, for a first one or more iterations, an indication of a first one or more out-ofband frequency bands of the output signal of the PA and, for a second one or more iterations, of a second one or more out-of-band frequency bands of the output signal of the PA.

Clause 50: The method of any combination of clauses 39-49, wherein the PA model is used iteratively to determine the DPD to apply to an input signal to the PA, and wherein the information comprises a number of the iterations.

Clause 51: The method of any combination of clauses 33-50, further comprising sending information to the second device for determining the changed effective PA model.

Clause 52: An apparatus, comprising: a memory comprising executable instructions; and a processor configured to execute the executable instructions and cause the apparatus to perform a method in accordance with any one of Clauses 1-51.

Clause 53: An apparatus, comprising means for performing a method in accordance with any one of Clauses 1-51.

Clause 54: A non-transitory computer-readable medium comprising executable instructions that, when executed by a processor of an apparatus, cause the apparatus to perform a method in accordance with any one of Clauses 1-51.

Clause 55: A computer program product embodied on a computer-readable storage medium comprising code for performing a method in accordance with any one of Clauses 1-51.

Additional Wireless Communication Network Considerations

The techniques and methods described herein may be used for various wireless communications networks. While aspects may be described herein using terminology commonly associated with 3G, 4G, and/or 5G wireless technologies, aspects of the present disclosure may likewise be applicable to other communication systems and standards not explicitly mentioned herein.

Returning to FIG. 1, various aspects of the present disclosure may be performed within the example wireless communication network 100.

FIG. 1 depicts various example UEs 104, which may more generally include: a cellular phone, smart phone, session initiation protocol (SIP) phone, laptop, personal digital assistant (PDA), satellite radio, global positioning system, multimedia device, video device, digital audio player, camera, game console, tablet, smart device, wearable device, vehicle, electric meter, gas pump, large or small kitchen appliance, healthcare device, implant, sensor/actuator, display, internet of things (IoT) devices, always on (AON) devices, edge processing devices, or other similar devices. UEs 104 may also be referred to more generally as a mobile device, a wireless device, a wireless communications device, a station, a mobile station, a subscriber station, a mobile subscriber station, a mobile unit, a subscriber unit, a wireless unit, a remote unit, a remote device, an access terminal, a mobile terminal, a wireless terminal, a remote terminal, a handset, and others.

FIG. 1 depicts various example BSs 102, which may more generally include: a NodeB, enhanced NodeB (eNB), next generation enhanced NodeB (ng-eNB), next generation NodeB (gNB or gNodeB), access point, base transceiver station, radio base station, radio transceiver, transceiver function, transmission reception point, and others. Each of BSs 102 may provide communication coverage for a respective geographic coverage area 110, which may sometimes be referred to as a cell, and which may overlap in some cases (e.g., small cell 102' may have a coverage area 110' that overlaps the coverage area 110 of a macro cell). A BS may, for example, provide communication coverage for a macro cell (covering relatively large geographic area), a pico cell (covering relatively smaller geographic area, such as a sports stadium), a femto cell (relatively smaller geographic area (e.g., a home)), and/or other types of cells.

While BSs 102 are depicted in various aspects as unitary communication devices, BSs 102 may be implemented in various configurations. For example, one or more components of base station may be disaggregated, including a central unit (CU), one or more distributed units (DUs), one or more radio units (RUs), a radio unit (RU), a Near-Real Time (Near-RT) RAN Intelligent Controller (RIC), or a Non-Real Time (Non-RT) RIC, to name a few examples. In another example, various aspects of a base station may be virtualized. More generally, a base station (e.g., BS 102) may include components that are located at a single physical location or components located at various physical locations. In examples in which a base station includes components that are located at various physical locations, the various components may each perform functions such that, collectively, the various components achieve functionality that is similar to a base station that is located at a single physical location. In some aspects, a base station including components that are located at various physical locations may be referred to as a disaggregated radio access network architecture, such as an Open RAN (O-RAN) or Virtualized RAN (VRAN) architecture.

Different BSs 102 within wireless communication network 100 may also be configured to support different radio access technologies, such as 3G, 4G, and 5G. For example, BSs 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., an S1 interface). BSs 102 configured for 5G (e.g., 5G NR or Next Generation RAN (NG-RAN)) may interface with 5GC 190 through second backhaul links 184. BSs 102 may communicate directly or indirectly (e.g., through the EPC 160 or 5GC 190) with each other over third backhaul links 134 (e.g., X2 interface), which may be wired or wireless.

Wireless communication network 100 may subdivide the electromagnetic spectrum into various classes, bands, channels, or other features. In some aspects, the subdivision is provided based on wavelength and frequency, where frequency may also be referred to as a carrier, a subcarrier, a frequency channel, a tone, or a subband. For example, 3GPP currently defines Frequency Range 1 (FR1) as including 600 MHz-6 GHz, which is often referred to (interchangeably) as "Sub-6 GHz". Similarly, 3GPP currently defines Frequency Range 2 (FR2) as including 26-41 GHz, which is sometimes referred to (interchangeably) as a "millimeter wave" ("mmW" or "mmWave"). A base station configured to communicate using mmWave/near mmWave radio frequency bands (e.g., a mmWave base station such as BS 180) may utilize beamforming (e.g., 182) with a UE (e.g., 104) to improve path loss and range.

The communication links 120 between BSs 102 and, for example, UEs 104, may be through one or more carriers, which may have different bandwidths (e.g., 5, 10, 15, 20, 100, 400, and other MHz), and which may be aggregated in various aspects. Carriers may or may not be adjacent to each other. Allocation of carriers may be asymmetric with respect to DL and UL (e.g., more or fewer carriers may be allocated for DL than for UL).

Wireless communication network 100 further includes a Wi-Fi AP 150 in communication with Wi-Fi stations (STAs) 152 via communication links 154 in, for example, a 2.4 GHz and/or 5 GHz unlicensed frequency spectrum.

Certain UEs 104 may communicate with each other using device-to-device (D2D) communication link 158. D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH).

EPC 160 may include various functional components, including: a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172 in the depicted example. MME 162 may be in communication with a Home Subscriber Server (HSS) 174. MME 162 is the control node that processes the signaling between the UEs 104 and the EPC 160. Generally, MME 162 provides bearer and connection management.

Generally, user Internet protocol (IP) packets are transferred through Serving Gateway 166, which itself is connected to PDN Gateway 172. PDN Gateway 172 provides UE IP address allocation as well as other functions. PDN Gateway 172 and the BM-SC 170 are connected to IP Services 176, which may include, for example, the Internet, an intranet, an IP Multimedia Subsystem (IMS), a Packet Switched (PS) streaming service, and/or other IP services.

BM-SC 170 may provide functions for MBMS user service provisioning and delivery. BM-SC 170 may serve as an entry point for content provider MBMS transmission, may be used to authorize and initiate MBMS Bearer Services within a public land mobile network (PLMN), and may be used to schedule MBMS transmissions. MBMS Gateway 168 may be used to distribute MBMS traffic to the BSs 102 belonging to a Multicast Broadcast Single Frequency Network (MBSFN) area broadcasting a particular service, and may be responsible for session management (start/stop) and for collecting eMBMS related charging information.

5GC 190 may include various functional components, including: an Access and Mobility Management Function (AMF) 192, other AMFs 193, a Session Management Function (SMF) 194, and a User Plane Function (UPF) 195. AMF 192 may be in communication with Unified Data Management (UDM) 196.

AMF 192 is a control node that processes signaling between UEs 104 and 5GC 190. AMF 192 provides, for example, quality of service (QoS) flow and session management.

Internet protocol (IP) packets are transferred through UPF 195, which is connected to the IP Services 197, and which provides UE IP address allocation as well as other functions for 5GC 190. IP Services 197 may include, for example, the Internet, an intranet, an IMS, a PS streaming service, and/or other IP services.

Returning to FIG. 2, various example components of a BS 102 and a UE 104 are depicted, which may be used to implement aspects of the present disclosure.

In regards to an example downlink transmission, BS 102 includes a transmit processor 220 that may receive data from a data source 212 and control information from a controller/processor 240. The control information may be for the physical broadcast channel (PBCH), physical control format indicator channel (PCFICH), physical HARQ indicator channel (PHICH), physical downlink control channel (PDCCH), group common PDCCH (GC PDCCH), and others. The data may be for the physical downlink shared channel (PDSCH), in some examples.

Transmit processor 220 may process (e.g., encode and symbol map) the data and control information to obtain data symbols and control symbols, respectively. Transmit processor 220 may also generate reference symbols, such as for the primary synchronization signal (PSS), secondary synchronization signal (SSS), PBCH demodulation reference signal (DMRS), and channel state information reference signal (CSI-RS).

Transmit (TX) multiple-input multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream to obtain an output sample stream. Each modulator may further process (e.g., convert to analog, amplify, filter, and upconvert) the output sample stream to obtain a downlink signal. Downlink signals from the modulators in transceivers 232a-232t may be transmitted via the antennas 234a-234t, respectively.

In order to receive the downlink transmission, UE 104 includes antennas 252a-252r that may receive the downlink signals from the BS 102 and may provide received signals to the demodulators (DEMODs) in transceivers 254a-254r, respectively. Each demodulator in transceivers 254a-254r may condition (e.g., filter, amplify, downconvert, and digitize) a respective received signal to obtain input samples. Each demodulator may further process the input samples to obtain received symbols.

MIMO detector 256 may obtain received symbols from all the demodulators in transceivers 254a-254r, perform MIMO detection on the received symbols if applicable, and provide detected symbols. Receive processor 258 may process (e.g., demodulate, deinterleave, and decode) the detected symbols, provide decoded data for the UE 104 to a data sink 260, and provide decoded control information to a controller/processor 280.

In regards to an example uplink transmission, UE 104 further includes a transmit processor 264 that may receive and process data (e.g., for the PUSCH) from a data source 262 and control information (e.g., for the physical uplink control channel (PUCCH)) from the controller/processor 280. Transmit processor 264 may also generate reference symbols for a reference signal (e.g., for the sounding reference signal (SRS)). The symbols from the transmit processor 264 may be precoded by a TX MIMO processor 266 if applicable, further processed by the modulators in transceivers 254a-254r (e.g., for SC-FDM), and transmitted to BS 102.

At BS 102, the uplink signals from UE 104 may be received by antennas 234a-t, processed by the demodulators in transceivers 232a-232t, detected by a MIMO detector 236 if applicable, and further processed by a receive processor 238 to obtain decoded data and control information sent by UE 104. Receive processor 238 may provide the decoded data to a data sink 239 and the decoded control information to the controller/processor 240.

Memories 242 and 282 may store data and program codes for BS 102 and UE 104, respectively.

Scheduler 244 may schedule UEs for data transmission on the downlink and/or uplink.

In various aspects, BS 102 may be described as transmitting and receiving various types of data associated with the methods described herein. In these contexts, "transmitting" may refer to various mechanisms of outputting data, such as outputting data from data source 212, scheduler 244, memory 242, transmit processor 220, controller/processor 240, TX MIMO processor 230, transceivers 232a-t, antenna 234a-t, and/or other aspects described herein. Similarly, "receiving" may refer to various mechanisms of obtaining data, such as obtaining data from antennas 234a-t, transceivers 232a-t, RX MIMO detector 236, controller/processor 240, receive processor 238, scheduler 244, memory 242, and other aspects described herein.

In various aspects, UE 104 may likewise be described as transmitting and receiving various types of data associated with the methods described herein. In these contexts, "transmitting" may refer to various mechanisms of outputting data, such as outputting data from data source 262, memory 282, transmit processor 264, controller/processor 280, TX MIMO processor 266, transceivers 254a-t, antenna 252a-t, and/or other aspects described herein. Similarly, "receiving" may refer to various mechanisms of obtaining data, such as obtaining data from antennas 252a-t, transceivers 254a-t, RX MIMO detector 256, controller/processor 280, receive processor 258, memory 282, and other aspects described herein.

In some aspects, a processor may be configured to perform various operations, such as those associated with the methods described herein, and transmit (output) to or receive (obtain) data from another interface that is configured to transmit or receive, respectively, the data.

As above, FIGS. 3A, 3B, 3C, and 3D depict various example aspects of data structures that may be used in wireless communication network 100 of FIG. 1.

Wireless communication systems may utilize orthogonal frequency division multiplexing (OFDM) with a cyclic prefix (CP) on the uplink and downlink. Such systems may also support half-duplex operation using time division duplexing (TDD). OFDM and single-carrier frequency division multiplexing (SC-FDM) partition the system bandwidth (e.g., as depicted in FIGS. 3B and 3D) into multiple orthogonal subcarriers. Each subcarrier may be modulated with data. Modulation symbols may be sent in the frequency domain with OFDM and in the time domain with SC-FDM.

A wireless communication frame structure may be frequency division duplex (FDD), in which for a particular set of subcarriers and subframes within the set of subcarriers are dedicated for either DL or UL. Wireless communication frame structures may also be time division duplex (TDD), in which for a particular set of subcarriers and subframes within the set of subcarriers are dedicated for both DL and UL.

In FIGS. 3A and 3C, the wireless communication frame structure is TDD where D is DL, U is UL, and X is flexible for use between DL/UL. UEs may be configured with the slot format through a received slot format indicator (SFI) (dynamically through DL control information (DCI), or semi-statically/statically through radio resource control (RRC) signaling). In the depicted examples, a 10 ms frame is divided into 10 equally sized 1 ms subframes. Each subframe may include one or more time slots. In some examples, each slot may include 7 or 14 symbols, depending on the slot configuration. Subframes may also include mini-slots, which generally have fewer symbols than an entire slot. Other wireless communication technologies may have a different frame structure and/or different channels.

Generally, the number of slots within a subframe is based on a slot configuration and a numerology. For slot configuration 0, different numerologies (µ) 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology µ, there are 14 symbols/slot and $2^\mu$ slots/subframe. The subcarrier spacing and symbol length/duration are a function of the numerology. The subcarrier spacing may be equal to $2^\mu \times 15$ kHz, where is the numerology 0 to 5. As such, the numerology µ=0 has a subcarrier spacing of 15 kHz and the numerology µ=5 has a subcarrier spacing of 480 kHz. The symbol length/duration is inversely related to the subcarrier spacing. FIGS. 3A, 3B, 3C, and 3D provide an example of slot configuration 0 with 14 symbols per slot and numerology µ=2 with 4 slots per subframe. The slot duration is 0.25 ms, the subcarrier spacing is 60 kHz, and the symbol duration is approximately 16.67 µs.

As depicted in FIGS. 3A, 3B, 3C, and 3D, a resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 3A, some of the REs carry reference (pilot) signals (RS) for a UE (e.g., UE 104 of FIGS. 1 and 2). The RS may include demodulation RS (DMRS) and channel state information reference signals (CSI-RS) for channel estimation at the UE. The RS may also include beam measurement RS (BRS), beam refinement RS (BRRS), and phase tracking RS (PT-RS).

FIG. 3B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol.

A primary synchronization signal (PSS) may be within symbol 2 of particular subframes of a frame. The PSS is used by a UE (e.g., 104 of FIGS. 1 and 2) to determine subframe/symbol timing and a physical layer identity.

A secondary synchronization signal (SSS) may be within symbol 4 of particular subframes of a frame. The SSS is used by a UE to determine a physical layer cell identity group number and radio frame timing.

Based on the physical layer identity and the physical layer cell identity group number, the UE can determine a physical cell identifier (PCI). Based on the PCI, the UE can determine the locations of the aforementioned DMRS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 3C, some of the REs carry DMRS (indicated as R for one particular configuration, but other DMRS configurations are possible) for channel estimation at the base station. The UE may transmit DMRS for the PUCCH and DMRS for the PUSCH. The PUSCH DMRS may be transmitted, for example, in the first one or two symbols of the PUSCH. The PUCCH DMRS may be transmitted in different configurations depending on whether short or long PUCCHs are transmitted and depending on the particular PUCCH format used. UE 104 may also transmit sounding reference signals (SRS). The SRS may be transmitted, for example, in the last symbol of a subframe. The SRS may have a comb structure, and a UE may transmit SRS on one of the combs. The SRS may be used by a base station for channel quality estimation to enable frequency-dependent scheduling on the UL.

FIG. 3D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Deployment of communication systems, such as 5G new radio (NR) systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (such as a Node B (NB), evolved NB (eNB), NR BS, 5G NB, access point (AP), a transmit receive point (TRP), or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more central or centralized units (CUs), one or more distributed units (DUs), or one or more radio units (RUs)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU and RU also can be implemented as virtual units, i.e., a virtual central unit (VCU), a virtual distributed unit (VDU), or a virtual radio unit (VRU).

Base station-type operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

Figure 17:
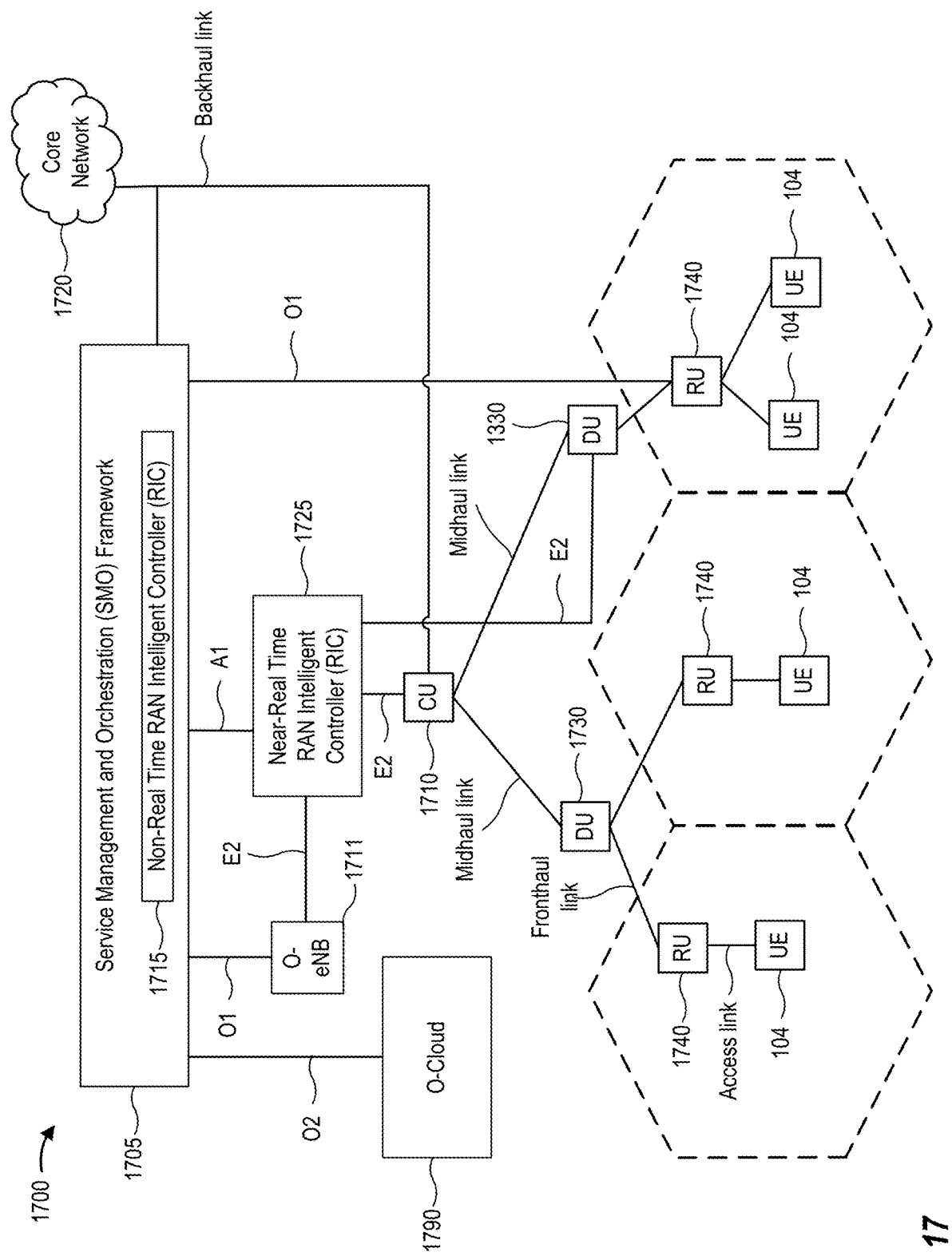
FIG. 17 depicts an example disaggregated base station (BS) architecture.

FIG. 17 depicts an example disaggregated base station 1700 architecture. The disaggregated base station 1700 architecture may include one or more central units (CUs) 1710 that can communicate directly with a core network 1720 via a backhaul link, or indirectly with the core network 1320 through one or more disaggregated base station units (such as a Near-Real Time (Near-RT) RAN Intelligent Controller (RIC) 1725 via an E2 link, or a Non-Real Time (Non-RT) RIC 1715 associated with a Service Management and Orchestration (SMO) Framework 1705, or both). A CU 1710 may communicate with one or more distributed units (DUs) 1730 via respective midhaul links, such as an F1 interface. The DUs 1730 may communicate with one or more radio units (RUs) 1740 via respective fronthaul links. The RUs 1740 may communicate with respective UEs 104 via one or more radio frequency (RF) access links. In some implementations, the UE 104 may be simultaneously served by multiple RUs 1740.

Each of the units, i.e., the CUs 1710, the DUs 1730, the RUs 1740, as well as the Near-RT RICs 1725, the Non-RT RICs 1715 and the SMO Framework 1705, may include one or more interfaces or be coupled to one or more interfaces configured to receive or transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or transmit signals over a wired transmission medium to one or more of the other units. Additionally, the units can include a wireless interface, which may include a receiver, a transmitter or transceiver (such as a radio frequency (RF) transceiver), configured to receive or transmit signals, or both, over a wireless transmission medium to one or more of the other units.

In some aspects, the CU 1710 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 1710. The CU 1710 may be configured to handle user plane functionality (i.e., Central Unit—User Plane (CU-UP)), control plane functionality (i.e., Central Unit—Control Plane (CU-CP)), or a combination thereof. In some implementations, the CU 1710 can be logically split into one or more CU-UP units and one or more CU-CP units. The CU-UP unit can communicate bidirectionally with the CU-CP unit via an interface, such as the E1 interface when implemented in an O-RAN configuration. The CU 1710 can be implemented to communicate with the DU 1730, as necessary, for network control and signaling.

The DU 1730 may correspond to a logical unit that includes one or more base station functions to control the operation of one or more RUs 1740. In some aspects, the DU 1730 may host one or more of a radio link control (RLC) layer, a medium access control (MAC) layer, and one or more high physical (PHY) layers (such as modules for forward error correction (FEC) encoding and decoding, scrambling, modulation and demodulation, or the like) depending, at least in part, on a functional split, such as those defined by the 3$^{rd}$ Generation Partnership Project (3GPP). In some aspects, the DU 1730 may further host one or more low PHY layers. Each layer (or module) can be implemented with an interface configured to communicate signals with other layers (and modules) hosted by the DU 1730, or with the control functions hosted by the CU 1710.

Lower-layer functionality can be implemented by one or more RUs 1740. In some deployments, an RU 1740, controlled by a DU 1730, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 1740 can be implemented to handle over the air (OTA) communication with one or more UEs 104. In some implementations, real-time and non-real-time aspects of control and user plane communication with the RU(s) 1740 can be controlled by the corresponding DU 1730. In some scenarios, this configuration can enable the DU(s) 1730 and the CU 1710 to be implemented in a cloud-based RAN architecture, such as a vRAN architecture.

The SMO Framework 1705 may be configured to support RAN deployment and provisioning of non-virtualized and virtualized network elements. For non-virtualized network elements, the SMO Framework 1705 may be configured to support the deployment of dedicated physical resources for RAN coverage requirements which may be managed via an operations and maintenance interface (such as an O1 interface). For virtualized network elements, the SMO Framework 1705 may be configured to interact with a cloud computing platform (such as an open cloud (O-Cloud) 1790) to perform network element life cycle management (such as to instantiate virtualized network elements) via a cloud computing platform interface (such as an O2 interface). Such virtualized network elements can include, but are not limited to, CUs 1710, DUs 1730, RUs 1740 and Near-RT RICs 1725. In some implementations, the SMO Framework 1705 can communicate with a hardware aspect of a 4G RAN, such as an open eNB (O-eNB) 1711, via an O1 interface. Additionally, in some implementations, the SMO Framework 1705 can communicate directly with one or more RUs 1740 via an O1 interface. The SMO Framework 1705 also may include a Non-RT RIC 1715 configured to support functionality of the SMO Framework 1705.

The Non-RT RIC 1715 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC X25. The Non-RT RIC 1715 may be coupled to or communicate with (such as via an A1 interface) the Near-RT RIC 1725. The Near-RT RIC 1725 may be configured to include a logical function that enables near-real-time control and optimization of RAN elements and resources via data collection and actions over an interface (such as via an E2 interface) connecting one or more CUs 1710, one or more DUs 1730, or both, as well as an O-eNB, with the Near-RT RIC 1725.

In some implementations, to generate AI/ML models to be deployed in the Near-RT RIC 1725, the Non-RT RIC 1715 may receive parameters or external enrichment information from external servers. Such information may be utilized by the Near-RT RIC 1725 and may be received at the SMO Framework 1705 or the Non-RT RIC 1715 from non-network data sources or from network functions. In some examples, the Non-RT RIC 1715 or the Near-RT RIC 1725 may be configured to tune RAN behavior or performance. For example, the Non-RT RIC 1715 may monitor long-term trends and patterns for performance and employ AI/ML models to perform corrective actions through the SMO Framework 1705 (such as reconfiguration via O1) or via creation of RAN management policies (such as A1 policies).

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for". All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A first device configured for wireless communication, comprising:
a memory comprising computer-executable instructions; and
a processor configured to execute the computer-executable instructions and cause the first device to:
output an indication, to a second device, indicating an effective power amplifier (PA) model of a PA of the first device has changed;
apply a digital pre-distortion (DPD) to a first signal input to the PA, wherein the DPD is based on the effective PA model that has changed; and
output a signal output of the PA to the second device.

2. The first device of claim 1, wherein the effective PA model comprises a crest factor reduction (CFR), a second DPD applied to a second signal input to the PA of the first device, and a PA model of the PA of the first device.

3. The first device of claim 2, wherein the processor is further configured to cause the first device to determine the effective PA model has changed based on determining the CFR has changed, the second DPD applied to the second signal input to the PA of the first device has changed, or a combination thereof.

4. The first device of claim 3, wherein the processor is further configured to cause the first device to determine a temperature change of the PA, a modulation applied to the second signal input to the PA has changed, a maximum power reduction (MPR) value of the first device has changed, or a combination thereof.

5. The first device of claim 1, wherein the processor is further configured to cause the first device to output a DPD capability of the first device for transmission to the second device.

6. The first device of claim 1, wherein the processor is further configured to cause the first device to obtain signaling indicating a digital post-distortion (DPoD) capability of the second device.

7. The first device of claim 1, wherein the processor is further configured to cause the first device to output information for transmission to the second device for determining the effective PA model that changed.

8. The first device of claim 7, wherein the information comprises one or more of: a set of non-linearity kernels associated with the effective PA model, a Bussgang coefficient value, a distortion value, a power scaling value, or a combination thereof.

9. The first device of claim 7, wherein the information comprises the effective PA model that changed.

10. The first device of claim 7, wherein the information comprises an indication of one or more frequency bands in which distortion is reduced in an output signal of the PA.

11. The first device of claim 10, wherein the indication of the one or more frequency bands comprises a plurality of weights and a plurality of frequency bands to which the plurality of weights are applied.

12. The first device of claim 10, wherein the indication of the one or more frequency bands comprises an indication of all in-band and out-of-band frequency bands of the output signal of the PA.

13. The first device of claim 10, wherein the indication of the one or more frequency bands comprises an indication of only out-of-band frequency bands of the output signal of the PA.

14. The first device of claim 10, wherein:
the processor is further configured to cause the first device to iteratively determine the DPD to apply to the first signal input to the PA based on the effective PA model; and
the indication of the one or more frequency bands comprises an indication, per iteration, of one or more frequency bands in which distortion in the output signal of the PA is reduced.

15. The first device of claim 1, further comprising receiving information from the second device for determining the effective PA model that changed.

16. A first device configured for wireless communication, comprising:
a memory comprising computer-executable instructions; and
a processor configured to execute the computer-executable instructions and cause the first device to:
obtain signaling from a second device indicating an effective power amplifier (PA) model of a PA of the second device has changed; and
apply a digital post-distortion (DPoD) to a signal received from the second device based on the effective PA model that has changed.

17. The first device of claim 16, wherein the effective PA model comprises a crest factor reduction (CFR), a digital pre-distortion (DPD) applied to a signal input to the PA of the second device, and a PA model of the PA of the second device.

18. The first device of claim 17, wherein the indication the effective PA model has changed comprises an indication the CFR has changed, the DPD applied to the signal input to the PA of the second device has changed, or a combination thereof.

19. The first device of claim 18, wherein the indication the CFR or DPD has changed comprises an indication of a temperature change of the PA, a modulation applied to the signal input to the PA has changed, a maximum power reduction (MPR) value of the second device has changed, or a combination thereof.

20. The first device of claim 17, wherein the processor is further configured to cause the first device to obtain signaling of a DPD capability of the second device.

21. The first device of claim 16, wherein the processor is further configured to cause the first device to output signaling to the second device indicating a DPoD capability of the first device.

22. The first device of claim 16, wherein the processor is further configured to cause the first device to:
- obtain information from the second device; and
- determine the changed effective PA model based on the information.

23. The first device of claim 22, wherein the information comprises a set of non-linearity kernels associated with the effective PA model.

24. The first device of claim 22, wherein the information comprises the changed effective PA model.

25. The first device of claim 22, wherein the information comprises a Bussgang coefficient value, a distortion value, a power scaling value, or a combination thereof.

26. The first device of claim 22, wherein the information comprises an indication of one or more frequency bands in which distortion is reduced in an output signal of the PA.

27. The first device of claim 26, wherein the indication of the one or more frequency bands comprises a plurality of weights and a plurality of frequency bands to which the plurality of weights are applied.

28. The first device of claim 26, wherein:
- the PA model is used iteratively to determine a digital post distortion (DPD) applied to an input signal to the PA; and
- the indication of the one or more frequency bands comprises an indication, per iteration, of one or more frequency bands in which distortion in the output signal of the PA is reduced.

29. The first device of claim 28, wherein the indication of the one or more frequency bands comprises an indication, for each iteration, of all in-band and out-of-band frequency bands of the output signal of the PA.

30. A method for wireless communication by a first device, the method comprising:
- transmitting an indication, to a second device, indicating an effective power amplifier (PA) model of a PA of the first device has changed;
- applying a digital pre-distortion (DPD) to a first signal input to the PA, wherein the DPD is based on the effective PA model that has changed; and
- transmitting a signal output of the PA to the second device.

* * * * *